United States Patent
Haftbaradaran et al.

(10) Patent No.: US 11,152,953 B2
(45) Date of Patent: Oct. 19, 2021

(54) ERROR DETECTION FOR A WIRELESS CHANNEL

(71) Applicant: QUALCOMM Incorporated, San Diego, CA (US)

(72) Inventors: Afshin Haftbaradaran, San Diego, CA (US); Ming Ta Lin, San Jose, CA (US); Shravan Kumar Reddy Garlapati, San Diego, CA (US); Alessandro Risso, San Diego, CA (US); Alexandre Pierrot, San Diego, CA (US); Harsha Narasimha Acharya, Santa Clara, CA (US); Subramanya Rao, Sunnyvale, CA (US); Li Zhang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/805,636

(22) Filed: Feb. 28, 2020

(65) Prior Publication Data

US 2021/0273651 A1  Sep. 2, 2021

(51) Int. Cl.
*H03M 13/09* (2006.01)
*G06F 1/3287* (2019.01)
*H03M 13/27* (2006.01)
*H03M 13/13* (2006.01)

(52) U.S. Cl.
CPC .......... *H03M 13/09* (2013.01); *G06F 1/3287* (2013.01); *H03M 13/13* (2013.01); *H03M 13/2792* (2013.01)

(58) Field of Classification Search
CPC .. H03M 13/09; H03M 13/13; H03M 13/2792; G06F 1/3287
See application file for complete search history.

(56) References Cited

U.S. PATENT DOCUMENTS

| 8,520,759 B2* | 8/2013 | Kim | H03M 13/6306 375/267 |
| 2007/0183506 A1* | 8/2007 | Chujoh | H04N 19/69 375/240.23 |
| 2008/0052603 A1* | 2/2008 | Wiatrowski | H04L 1/0041 714/776 |
| 2015/0331742 A1* | 11/2015 | Liang | G11C 29/52 714/764 |
| 2018/0199359 A1 | 7/2018 | Cao et al. | |

(Continued)

*Primary Examiner* — Guy J Lamarre
(74) *Attorney, Agent, or Firm* — Holland & Hart LLP

(57) ABSTRACT

Methods, systems, and devices for wireless communications are described. In some systems, a first device may transmit a signal to a second device including a number of error detection bits interleaved with a number of information bits. The second device may use the error detection bits to determine if the signal was received correctly, where each error detection bit may be associated with a set of information bits. The second device may progressively decode the signal and continuously perform an error detection calculation based on a first set of information bits associated with a first error detection bit. Based on the error detection calculation, the second device may calculate an expected error detection bit corresponding to the first error detection bit. The second device may compare the first error detection bit to the expected error detection bit. Other aspects and features are also claimed and described.

28 Claims, 14 Drawing Sheets

(56) References Cited

U.S. PATENT DOCUMENTS

| | | |
|---|---|---|
| 2019/0036550 A1 | 1/2019 | Koike-Akino |
| 2019/0097756 A1* | 3/2019 | Chatterjee ............. H04L 1/0061 |
| 2019/0132011 A1* | 5/2019 | Chandesris ......... H03M 13/458 |
| 2019/0149365 A1 | 5/2019 | Chatterjee et al. |
| 2019/0327024 A1 | 10/2019 | Lee et al. |
| 2020/0403728 A1* | 12/2020 | Chen .................... H04L 1/0071 |

* cited by examiner

ERROR DETECTION FOR A WIRELESS CHANNEL

FIELD OF TECHNOLOGY

The following relates generally to wireless communications and more specifically to error detection method for a wireless channel. Various embodiments enable and provide techniques to aid in reducing decoding latency and/or opportunistically halting decode operations.

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of such multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM). A wireless multiple-access communications system may include one or more base stations or one or more network access nodes, each simultaneously supporting communication for multiple communication devices, which may be otherwise known as user equipment (UE).

In some wireless communications systems, a first device may transmit a signal including a number of information bits to a second device via a communication channel. The signal may also include a number of error detection bits associated with the information bits, which the second device may use to determine if the signal was received correctly. In some cases, the first device may interleave and encode the signal prior to transmitting the signal to the second device. The second device may receive the signal and perform an error check to determine if the signal was received correctly. In some cases, current techniques for performing error checks may be inefficient and result in long decoding operations at the second device.

SUMMARY

The described techniques relate to improved methods, systems, devices, and apparatuses that support error detection method for a wireless channel. Generally, the described techniques provide for efficient early terminations of a decoding operation of a received signal. In some examples, a first device may transmit a signal to a second device, the signal may include a quantity of information values (e.g., payload bits) and a quantity of error detection values (e.g., parity bits). Prior to transmission, the first device may interleave the error detection values with the information values such that the number of error detection values are spread throughout the signal. In addition, in some examples, prior to transmission, the first device may encode the interleaved data using a polar code. In some cases, the first device may encode the interleaved signal and transmit the signal to the second device, which may decode and de-interleave the signal.

In some implementations of the present disclosure, the second device may receive (e.g., decode and deinterleave) a first set of the number of information values and may calculate an expected error detection value based on the first set of information values. In some aspects, the second device may perform an error check on the signal (e.g., on the first set of information values included in the signal). Based on performing the error check, the second device may compare the expected error detection value to an error detection value that is received in the signal (e.g., and that is associated with the first set of information values). In some examples, the second device may determine that the value associated with the expected error detection value is different than the received error detection value. Accordingly, in such examples, the second device may determine that the first set of information values in the signal were received incorrectly and may stop decoding the signal (e.g., terminate a decoding operation associated with receiving the signal). The techniques for doing error detection based early termination of decoding may be configured to work with signals that are associated with successive cancelation decoding, such as polar decoding.

A method of wireless communication is described. The method may include receiving a signal that includes a set of error detection values and a set of information values, determining a coefficient, the coefficient associated with a first information value of the set of information values, configured for determining at least one error detection value, determining a first error detection value based on the coefficient associated with the first information value, determining that a second error detection value received in the signal and associated with the first information value is different than the first error detection value, and terminating decoding of the signal based on the first error detection value and the second error detection value.

An apparatus for wireless communication is described. The apparatus may include a processor, memory coupled with the processor, and instructions stored in the memory. The instructions may be executable by the processor to cause the apparatus to receive a signal that includes a set of error detection values and a set of information values, determine a coefficient, the coefficient associated with a first information value of the set of information values, configured for determining at least one error detection value, determine a first error detection value based on the coefficient associated with the first information value, determine that a second error detection value received in the signal and associated with the first information value is different than the first error detection value, and terminate decoding of the signal based on the first error detection value and the second error detection value.

Another apparatus for wireless communication is described. The apparatus may include means for receiving a signal that includes a set of error detection values and a set of information values, determining a coefficient, the coefficient associated with a first information value of the set of information values, configured for determining at least one error detection value, determining a first error detection value based on the coefficient associated with the first information value, determining that a second error detection value received in the signal and associated with the first information value is different than the first error detection value, and terminating decoding of the signal based on the first error detection value and the second error detection value.

A non-transitory computer-readable medium storing code for wireless communication is described. The code may include instructions executable by a processor to receive a signal that includes a set of error detection values and a set of information values, determine a coefficient, the coefficient associated with a first information value of the set of information values, configured for determining at least one error detection value, determine a first error detection value based on the coefficient associated with the first information value, determine that a second error detection value received in the signal and associated with the first information value is different than the first error detection value, and terminate decoding of the signal based on the first error detection value and the second error detection value.

Some examples of the method, apparatuses, and non-transitory computer-readable medium described herein may further include operations, features, means, or instructions for determining an index value associated with the first information value based on receiving the signal, where determining the coefficient may be based on determining the index value.

In some examples of the method, apparatuses, and non-transitory computer-readable medium described herein, determining the coefficient further may include operations, features, means, or instructions for retrieving the coefficient from a memory based on the determined index value.

In some examples of the method, apparatuses, and non-transitory computer-readable medium described herein, determining the coefficient further may include operations, features, means, or instructions for determining a second index value and a third index value based on the index value associated with the first information value, and retrieving a value from a memory based on the second index value, where the coefficient may be determined based on the value retrieved from the memory and the third index value.

Some examples of the method, apparatuses, and non-transitory computer-readable medium described herein may further include operations, features, means, or instructions for applying a division operation using a second value to the index value to generate the second index value, where determining the second index value may be based on applying the division operation, and applying a modulo operation using the second value to the index value to generate the third index value, where determining the third index value may be based on applying the modulo operation.

In some examples of the method, apparatuses, and non-transitory computer-readable medium described herein, the memory stores a down-sampled set of coefficients associated with the set of information values.

Some examples of the method, apparatuses, and non-transitory computer-readable medium described herein may further include operations, features, means, or instructions for decoding the signal using a polar code to identify the first information value of the set of information values and the second error detection value of the set of error detection values included in the signal based on receiving the signal, where determining the coefficient may be based on decoding the signal using the polar code.

Some examples of the method, apparatuses, and non-transitory computer-readable medium described herein may further include operations, features, means, or instructions for deinterleaving the second error detection value from the set of information values of the signal based on decoding the signal using the polar code.

Some examples of the method, apparatuses, and non-transitory computer-readable medium described herein may further include operations, features, means, or instructions for entering a lower power mode of the user equipment based on terminating the decoding.

In some examples of the method, apparatuses, and non-transitory computer-readable medium described herein, the lower power mode may be a micro-sleep mode of the user equipment.

Some examples of the method, apparatuses, and non-transitory computer-readable medium described herein may further include operations, features, means, or instructions for applying an identifier mask to the first error detection value, where determining that the first error detection value may be different than the second error detection value may be based on applying the identifier mask to the first error detection value.

Some examples of the method, apparatuses, and non-transitory computer-readable medium described herein may further include operations, features, means, or instructions for applying a set of identifier masks to the first error detection value to generate a set of candidate values, respectively, and comparing each value of the set of candidate values to the second error detection value, where determining that the first error detection value may be different than the second error detection value may be based on comparing each value of the set of candidate values to the second error detection value.

Some examples of the method, apparatuses, and non-transitory computer-readable medium described herein may further include operations, features, means, or instructions for accumulating one or more information values and one or more coefficients, where determining the first error detection value may be based on accumulating the set of information values and the one or more coefficients.

Some examples of the method, apparatuses, and non-transitory computer-readable medium described herein may further include operations, features, means, or instructions for identifying a set of information values of the signal associated with the second error detection value based on receiving the signal, where the set of information values includes the first information value, and determining a set of coefficients, each coefficient of the set of coefficients associated with an information value of the set of information values based on identifying the set of information values, where determining the first error detection value may be based on the set of coefficients and the set of information values.

Some examples of the method, apparatuses, and non-transitory computer-readable medium described herein may further include operations, features, means, or instructions for comparing the first error detection value with the second error detection value, where determining that the first error detection value may be different than the second error detection value may be based on comparing the first error detection value with the second error detection value.

In some examples of the method, apparatuses, and non-transitory computer-readable medium described herein, an error detection value may include an error detection bit and an information value may include an information bit.

In some examples of the method, apparatuses, and non-transitory computer-readable medium described herein, the first error detection value may be determined using the coefficient and the first information value.

In some examples of the method, apparatuses, and non-transitory computer-readable medium described herein, the set of error detection values may be interleaved with the set of information values.

DETAILED DESCRIPTION

Figure 1:
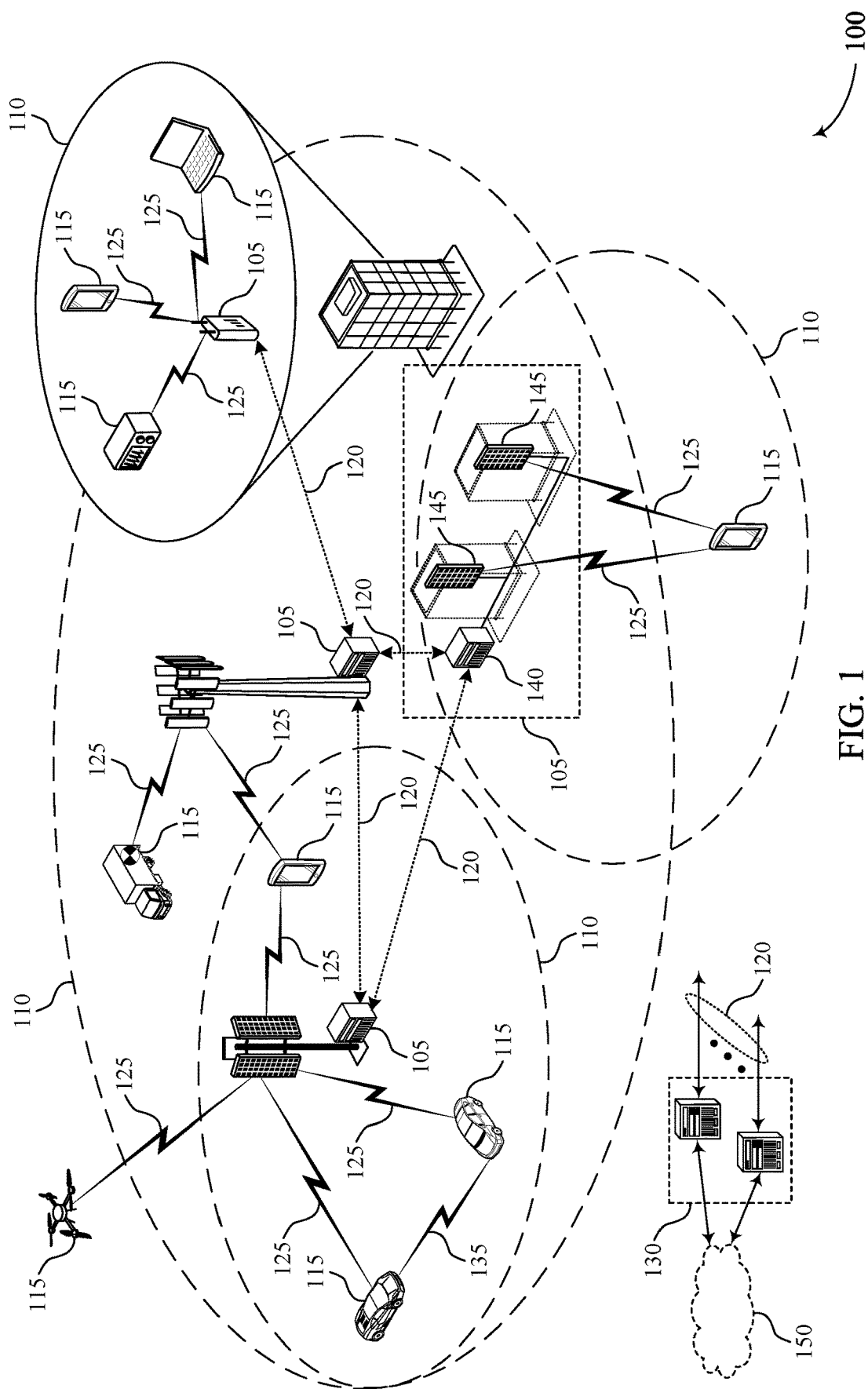
FIG. 1 illustrates an example of a system for wireless communications that supports error detection for a wireless channel in accordance with aspects of the present disclosure.

Various implementations relate generally to efficient error detection methods for a wireless channel. Some implementations more specifically relate to progressively performing error detection of a signal such that a receiving device may determine if the signal is received correctly with lower latency. In some implementations, a first device may transmit a signal in a communication channel (e.g., a downlink control channel) including a number of error detection values or bits (e.g., parity bits) interleaved with a number of information values or bits (e.g., payload bits). In some cases, the first device may encode the signal with a polar code prior to transmitting the signal to a second device. The second device may receive the signal in the communication channel and may decode (e.g., polar decode) and deinterleave the signal as part of a decoding operation of the signal. In some instances, the use of polar codes can prevent some early termination procedures because the polar code may cause the receiving device to receive the entire signal before error detection procedures may be performed. Techniques are described herein to enable early-termination of decoding based on error detection (e.g., cyclic redundancy check (CRC) procedure) on signals that are encoded. Encoded signals may be encoded via a polar code as well as other encoding techniques.

In some cases, each error detection bit of the number of error detection bits may be associated with a subset of the number of information bits. For example, the second device may determine if a subset of the number of information bits is received correctly based on the error detection bit associated with the subset of information bits. In some implementations, the second device may perform an error check based on the subset of information bits and the error detection bit associated with the subset of information bits. For example, the second device may determine (e.g., calculate) an expected error detection bit based on the subset of information bits and may compare the calculated error detection bit to the error detection bit received in the signal to determine if the error check passes or fails. If the subset of information bits were correctly received, the calculated error detection bit may match (e.g., be the same as) the error detection bit received in the signal. Otherwise, one or more of the subset of information bits may have been received incorrectly.

The second device may progressively calculate error detection bits as the signal is received. For example, the second device may receive a first set of information bits and may continuously perform an error detection computation (e.g., or continuously update an error detection computation) associated with determining an expected error detection bit as the first set of information bits are received. The expected error detection bit may be an error detection that the second device may expect to receive if the first set of information bits were received correctly. The second device may use the expected error detection bit to determine whether an error associated with the first set of information bits passes or fails an error check. For instance, the second device may compare the expected error detection bit to an error detection bit that the second device received in the signal to determine if the first set of information bits were received correctly.

In some examples, the second device may determine that the expected error detection bit is different than the error detection bit received in the signal. In such examples, the second device may determine that one or more information bits of the first set of information bits were received incorrectly (e.g., and therefore that the entire signal may be incorrect or corrupt). Accordingly, the second device may terminate the decoding operation associated with receiving the signal. In some aspects, the second device may terminate the decoding operation prior to decoding the entire signal.

Particular implementations of the subject matter described in this disclosure can be implemented to realize one or more of the following potential advantages. In some implementations, the described techniques can enable CRC-based early-termination of decoding a signal that was encoded using a polar code. In some implementations, the described techniques can be used to reduce latency for decoding a signal as compared to error detection methods that perform error detection after an entire signal has been received. For example, a device may receive a signal and progressively perform error detection computations associated with the signal as the signal is received. As such, the device may determine that an error exists in the polar encoded signal prior to decoding the entire signal and the device may terminate the decoding operation early, which may result in fewer decoding cycles compared to error detection methods that decode the entire signal prior to performing an error check. This may enable the device to power off one or more processing units associated with receiving or decoding a signal and to spend a longer duration in a sleep mode (e.g., a micro sleep mode). In such examples, the device may reduce power consumption and improve battery life. In some implementations, progressively performing error checks on a signal may reduce latency even in cases when the signal is correctly received.

For example, a device progressively performing error checks may finish an error check associated with a lastly received error detection bit at approximately the same time as the last error detection bit is received, while a legacy device may perform an error check for each of a number of error detection bits that were received in the signal after receiving the lastly received error detection bit. As such, a first device implementing aspects of the present disclosure may repurpose one or more processing units to a different processing task before the legacy device completes its error check procedure, which may result in increased processing capability and efficiency of the first device.

Aspects of the disclosure are initially described in the context of wireless communications systems. Additionally, aspects of the disclosure are described in the context of process flows and circuitry. Aspects of the disclosure are further illustrated by and described with reference to apparatus diagrams, system diagrams, and flowcharts that relate to error detection method for a wireless channel.

FIG. 1 illustrates an example of a wireless communications system 100 that supports error detection for a wireless channel in accordance with aspects of the present disclosure, in particular of any of the following examples. The wireless communications system 100 may include one or more base stations 105, one or more UEs 115, and a core network 130. In some examples, the wireless communications system 100 may be a Long Term Evolution (LTE) network, an LTE-Advanced (LTE-A) network, an LTE-A Pro network, or a New Radio (NR) network. In some examples, the wireless communications system 100 may support enhanced broadband communications, ultra-reliable (e.g., mission critical) communications, low latency communications, communications with low-cost and low-complexity devices, or any combination thereof.

The base stations 105 may be dispersed throughout a geographic area to form the wireless communications system 100 and may be devices in different forms or having different capabilities. The base stations 105 and the UEs 115 may wirelessly communicate via one or more communication links 125. Each base station 105 may provide a coverage area 110 over which the UEs 115 and the base station 105 may establish one or more communication links 125. The coverage area 110 may be an example of a geographic area over which a base station 105 and a UE 115 may support the communication of signals according to one or more radio access technologies.

The UEs 115 may be dispersed throughout a coverage area 110 of the wireless communications system 100, and each UE 115 may be stationary, or mobile, or both at different times. The UEs 115 may be devices in different forms or having different capabilities. Some example UEs 115 are illustrated in FIG. 1. The UEs 115 described herein may be able to communicate with various types of devices, such as other UEs 115, the base stations 105, or network equipment (e.g., core network nodes, relay devices, integrated access and backhaul (IAB) nodes, or other network equipment), as shown in FIG. 1.

The base stations 105 may communicate with the core network 130, or with one another, or both. For example, the base stations 105 may interface with the core network 130 through one or more backhaul links 120 (e.g., via an S1, N2, N3, or other interface). The base stations 105 may communicate with one another over the backhaul links 120 (e.g., via an X2, Xn, or other interface) either directly (e.g., directly between base stations 105), or indirectly (e.g., via core network 130), or both. In some examples, the backhaul links 120 may be or include one or more wireless links.

One or more of the base stations 105 described herein may include or may be referred to by a person having ordinary skill in the art as a base transceiver station, a radio base station, an access point, a radio transceiver, a NodeB, an eNodeB (eNB), a next-generation NodeB or a giga-NodeB (either of which may be referred to as a gNB), a Home NodeB, a Home eNodeB, or other suitable terminology.

A UE 115 may include or may be referred to as a mobile device, a wireless device, a remote device, a handheld device, or a subscriber device, or some other suitable terminology, where the "device" may also be referred to as a unit, a station, a terminal, or a client, among other examples. A UE 115 may also include or may be referred to as a personal electronic device such as a cellular phone, a personal digital assistant (PDA), a tablet computer, a laptop computer, or a personal computer. In some examples, a UE 115 may include or be referred to as a wireless local loop (WLL) station, an Internet of Things (IoT) device, an Internet of Everything (IoE) device, or a machine type communications (MTC) device, among other examples, which may be implemented in various objects such as appliances, or vehicles, meters, among other examples.

The UEs 115 described herein may be able to communicate with various types of devices, such as other UEs 115 that may sometimes act as relays as well as the base stations 105 and the network equipment including macro eNBs or gNBs, small cell eNBs or gNBs, or relay base stations, among other examples, as shown in FIG. 1.

The UEs 115 and the base stations 105 may wirelessly communicate with one another via one or more communication links 125 over one or more carriers. The term "carrier" may refer to a set of radio frequency spectrum resources having a defined physical layer structure for supporting the communication links 125. For example, a carrier used for a communication link 125 may include a portion of a radio frequency spectrum band (e.g., a bandwidth part (BWP)) that is operated according to one or more physical layer channels for a given radio access technology (e.g., LTE, LTE-A, LTE-A Pro, NR). Each physical layer channel may carry acquisition signaling (e.g., synchronization signals, system information), control signaling that coordinates operation for the carrier, user data, or other signaling. The wireless communications system 100 may support communication with a UE 115 using carrier aggregation or multi-carrier operation. A UE 115 may be configured with multiple downlink component carriers and one or more uplink component carriers according to a carrier aggregation configuration. Carrier aggregation may be used with both frequency division duplexing (FDD) and time division duplexing (TDD) component carriers.

In some examples (e.g., in a carrier aggregation configuration), a carrier may also have acquisition signaling or control signaling that coordinates operations for other carriers. A carrier may be associated with a frequency channel (e.g., an evolved universal mobile telecommunication system terrestrial radio access (E-UTRA) absolute radio frequency channel number (EARFCN)) and may be positioned according to a channel raster for discovery by the UEs 115. A carrier may be operated in a standalone mode where initial acquisition and connection may be conducted by the UEs 115 via the carrier, or the carrier may be operated in a non-standalone mode where a connection is anchored using a different carrier (e.g., of the same or a different radio access technology).

The communication links 125 shown in the wireless communications system 100 may include uplink transmissions from a UE 115 to a base station 105, or downlink transmissions from a base station 105 to a UE 115. Carriers may carry downlink or uplink communications (e.g., in an FDD mode) or may be configured to carry downlink and uplink communications (e.g., in a TDD mode).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of determined bandwidths for carriers of a particular radio access technology (e.g., 1.4, 3, 5, 10, 15, 20, 40, or 80 megahertz (MHz)). Devices of the wireless communications system 100 (e.g., the base stations 105, the UEs 115, or both) may have hardware configurations that support communications over a particular carrier bandwidth or may be configurable to support communications over one of a set of carrier bandwidths. In some examples, the wireless communications system 100 may include base stations 105 or UEs 115 that support simultaneous communications via carriers associated with multiple carrier bandwidths. In some examples, each served UE 115 may be configured for operating over portions (e.g., a sub-band, a BWP) or all of a carrier bandwidth.

Signal waveforms transmitted over a carrier may be made up of multiple subcarriers (e.g., using multi-carrier modulation (MCM) techniques such as orthogonal frequency division multiplexing (OFDM) or discrete Fourier transform spread OFDM (DFT-S-OFDM)). In a system employing MCM techniques, a resource element may consist of one symbol period (e.g., a duration of one modulation symbol) and one subcarrier, where the symbol period and subcarrier spacing are inversely related. The number of bits carried by each resource element may depend on the modulation scheme (e.g., the order of the modulation scheme, the coding rate of the modulation scheme, or both). Thus, the more resource elements that a UE 115 receives and the higher the order of the modulation scheme, the higher the data rate may be for the UE 115. A wireless communications resource may refer to a combination of a radio frequency spectrum resource, a time resource, and a spatial resource (e.g., spatial layers or beams), and the use of multiple spatial layers may further increase the data rate or data integrity for communications with a UE 115.

One or more numerologies for a carrier may be supported, where a numerology may include a subcarrier spacing ($\Delta f$) and a cyclic prefix. A carrier may be divided into one or more BWPs having the same or different numerologies. In some examples, a UE 115 may be configured with multiple BWPs. In some examples, a single BWP for a carrier may be active at a given time and communications for the UE 115 may be restricted to one or more active BWPs.

The time intervals for the base stations 105 or the UEs 115 may be expressed in multiples of a basic time unit which may, for example, refer to a sampling period of $T_s=1/(\Delta f_{max} \cdot N_f)$ seconds, where $\Delta f_{max}$ may represent the maximum supported subcarrier spacing, and $N_f$ may represent the maximum supported discrete Fourier transform (DFT) size. Time intervals of a communications resource may be organized according to radio frames each having a specified duration (e.g., 10 milliseconds (ms)). Each radio frame may be identified by a system frame number (SFN) (e.g., ranging from 0 to 1023).

Each frame may include multiple consecutively numbered subframes or slots, and each subframe or slot may have the same duration. In some examples, a frame may be divided (e.g., in the time domain) into subframes, and each subframe may be further divided into a number of slots. Alternatively, each frame may include a variable number of slots, and the number of slots may depend on subcarrier spacing. Each slot may include a number of symbol periods (e.g., depending on the length of the cyclic prefix prepended to each symbol period). In some wireless communications systems 100, a slot may further be divided into multiple mini-slots containing one or more symbols. Excluding the cyclic prefix, each symbol period may contain one or more (e.g., $N_f$) sampling periods. The duration of a symbol period may depend on the subcarrier spacing or frequency band of operation.

A subframe, a slot, a mini-slot, or a symbol may be the smallest scheduling unit (e.g., in the time domain) of the wireless communications system 100 and may be referred to as a transmission time interval (TTI). In some examples, the TTI duration (e.g., the number of symbol periods in a TTI) may be variable. Additionally or alternatively, the smallest scheduling unit of the wireless communications system 100 may be dynamically selected (e.g., in bursts of shortened TTIs (sTTIs)).

Physical channels may be multiplexed on a carrier according to various techniques. A physical control channel and a physical data channel may be multiplexed on a downlink carrier, for example, using one or more of time division multiplexing (TDM) techniques, frequency division multiplexing (FDM) techniques, or hybrid TDM-FDM techniques. A control region (e.g., a control resource set (CORESET)) for a physical control channel may be defined by a number of symbol periods and may extend across the system bandwidth or a subset of the system bandwidth of the carrier. One or more control regions (e.g., CORESETs) may be configured for a set of the UEs 115. For example, one or more of the UEs 115 may monitor or search control regions for control information according to one or more search space sets, and each search space set may include one or multiple control channel candidates in one or more aggregation levels arranged in a cascaded manner. An aggregation level for a control channel candidate may refer to a number of control channel resources (e.g., control channel elements (CCEs)) associated with encoded information for a control information format having a given payload size. Search space sets may include common search space sets configured for sending control information to multiple UEs 115 and UE-specific search space sets for sending control information to a specific UE 115.

Each base station 105 may provide communication coverage via one or more cells, for example a macro cell, a small cell, a hot spot, or other types of cells, or any combination thereof. The term "cell" may refer to a logical communication entity used for communication with a base station 105 (e.g., over a carrier) and may be associated with an identifier for distinguishing neighboring cells (e.g., a physical cell identifier (PCID), a virtual cell identifier (VCID), or others). In some examples, a cell may also refer to a geographic coverage area 110 or a portion of a geographic coverage area 110 (e.g., a sector) over which the logical communication entity operates. Such cells may range from smaller areas (e.g., a structure, a subset of structure) to larger areas depending on various factors such as the capabilities of the base station 105. For example, a cell may be or include a building, a subset of a building, or exterior spaces between or overlapping with geographic coverage areas 110, among other examples.

A macro cell generally covers a relatively large geographic area (e.g., several kilometers in radius) and may allow unrestricted access by the UEs 115 with service subscriptions with the network provider supporting the macro cell. A small cell may be associated with a lower-powered base station 105, as compared with a macro cell, and a small cell may operate in the same or different (e.g., licensed, unlicensed) frequency bands as macro cells. Small cells may provide unrestricted access to the UEs 115 with service subscriptions with the network provider or may provide restricted access to the UEs 115 having an association with the small cell (e.g., the UEs 115 in a closed subscriber group (CSG), the UEs 115 associated with users in a home or office). A base station 105 may support one or multiple cells and may also support communications over the one or more cells using one or multiple component carriers.

In some examples, a carrier may support multiple cells, and different cells may be configured according to different protocol types (e.g., MTC, narrowband IoT (NB-IoT), enhanced mobile broadband (eMBB)) that may provide access for different types of devices.

In some examples, a base station 105 may be movable and therefore provide communication coverage for a moving geographic coverage area 110. In some examples, different geographic coverage areas 110 associated with different technologies may overlap, but the different geographic coverage areas 110 may be supported by the same base station 105. In other examples, the overlapping geographic coverage areas 110 associated with different technologies may be supported by different base stations 105. The wireless communications system 100 may include, for example, a heterogeneous network in which different types of the base stations 105 provide coverage for various geographic coverage areas 110 using the same or different radio access technologies.

The wireless communications system 100 may support synchronous or asynchronous operation. For synchronous operation, the base stations 105 may have similar frame timings, and transmissions from different base stations 105 may be approximately aligned in time. For asynchronous operation, the base stations 105 may have different frame timings, and transmissions from different base stations 105 may, in some examples, not be aligned in time. The techniques described herein may be used for either synchronous or asynchronous operations.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay such information to a central server or application program that makes use of the information or presents the information to humans interacting with the application program. Some UEs 115 may be designed to collect information or enable automated behavior of machines or other devices. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples, half-duplex communications may be performed at a reduced peak rate. Other power conservation techniques for the UEs 115 include entering a power saving deep sleep mode when not engaging in active communications, operating over a limited bandwidth (e.g., according to narrowband communications), or a combination of these techniques. For example, some UEs 115 may be configured for operation using a narrowband protocol type that is associated with a defined portion or range (e.g., set of subcarriers or resource blocks (RBs)) within a carrier, within a guard-band of a carrier, or outside of a carrier.

The wireless communications system 100 may be configured to support ultra-reliable communications or low-latency communications, or various combinations thereof. For example, the wireless communications system 100 may be configured to support ultra-reliable low-latency communications (URLLC) or mission critical communications. The UEs 115 may be designed to support ultra-reliable, low-latency, or critical functions (e.g., mission critical functions). Ultra-reliable communications may include private communication or group communication and may be supported by one or more mission critical services such as mission critical push-to-talk (MCPTT), mission critical video (MCVideo), or mission critical data (MCData). Support for mission critical functions may include prioritization of services, and mission critical services may be used for public safety or general commercial applications. The terms ultra-reliable, low-latency, mission critical, and ultra-reliable low-latency may be used interchangeably herein.

In some examples, a UE 115 may also be able to communicate directly with other UEs 115 over a device-to-device (D2D) communication link 135 (e.g., using a peer-to-peer (P2P) or D2D protocol). One or more UEs 115 utilizing D2D communications may be within the geographic coverage area 110 of a base station 105. Other UEs 115 in such a group may be outside the geographic coverage area 110 of a base station 105 or be otherwise unable to receive transmissions from a base station 105. In some examples, groups of the UEs 115 communicating via D2D communications may utilize a one-to-many (1:M) system in which each UE 115 transmits to every other UE 115 in the group. In some examples, a base station 105 facilitates the scheduling of resources for D2D communications. In other cases, D2D communications are carried out between the UEs 115 without the involvement of a base station 105.

In some systems, the D2D communication link 135 may be an example of a communication channel, such as a sidelink communication channel, between vehicles (e.g., UEs 115). In some examples, vehicles may communicate using vehicle-to-everything (V2X) communications, vehicle-to-vehicle (V2V) communications, or some combination of these. A vehicle may signal information related to traffic conditions, signal scheduling, weather, safety, emergencies, or any other information relevant to a V2X system. In some examples, vehicles in a V2X system may communicate with roadside infrastructure, such as roadside units, or with the network via one or more network nodes (e.g., base stations 105) using vehicle-to-network (V2N) communications, or with both.

The core network 130 may provide user authentication, access authorization, tracking, Internet Protocol (IP) connectivity, and other access, routing, or mobility functions. The core network 130 may be an evolved packet core (EPC) or 5G core (5GC), which may include at least one control plane entity that manages access and mobility (e.g., a mobility management entity (MME), an access and mobility management function (AMF)) and at least one user plane entity that routes packets or interconnects to external networks (e.g., a serving gateway (S-GW), a Packet Data Network (PDN) gateway (P-GW), or a user plane function (UPF)). The control plane entity may manage non-access stratum (NAS) functions such as mobility, authentication, and bearer management for the UEs 115 served by the base stations 105 associated with the core network 130. User IP packets may be transferred through the user plane entity, which may provide IP address allocation as well as other functions. The user plane entity may be connected to the network operators IP services 150. The operators IP services 150 may include access to the Internet, Intranet(s), an IP Multimedia Subsystem (IMS), or a Packet-Switched Streaming Service.

Some of the network devices, such as a base station 105, may include subcomponents such as an access network entity 140, which may be an example of an access node controller (ANC). Each access network entity 140 may communicate with the UEs 115 through one or more other access network transmission entities 145, which may be referred to as radio heads, smart radio heads, or transmission/reception points (TRPs). Each access network transmission entity 145 may include one or more antenna panels. In some configurations, various functions of each access network entity 140 or base station 105 may be distributed across various network devices (e.g., radio heads and ANCs) or consolidated into a single network device (e.g., a base station 105).

The wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band because the wavelengths range from approximately one decimeter to one meter in length. The UHF waves may be blocked or redirected by buildings and environmental features, but the waves may penetrate structures sufficiently for a macro cell to provide service to the UEs 115 located indoors. The transmission of UHF waves may be associated with smaller antennas and shorter ranges (e.g., less than 100 kilometers) compared to transmission using the smaller frequencies and longer waves of the high frequency (ff) or very high frequency (VHF) portion of the spectrum below 300 MHz.

The wireless communications system 100 may also operate in a super high frequency (SHF) region using frequency bands from 3 GHz to 30 GHz, also known as the centimeter band, or in an extremely high frequency (EHF) region of the spectrum (e.g., from 30 GHz to 300 GHz), also known as the millimeter band. In some examples, the wireless communications system 100 may support millimeter wave (mmW) communications between the UEs 115 and the base stations 105, and EHF antennas of the respective devices may be smaller and more closely spaced than UHF antennas. In some examples, this may facilitate use of antenna arrays within a device. The propagation of EHF transmissions, however, may be subject to even greater atmospheric attenuation and shorter range than SHF or UHF transmissions. The techniques disclosed herein may be employed across transmissions that use one or more different frequency regions, and designated use of bands across these frequency regions may differ by country or regulating body.

The wireless communications system 100 may utilize both licensed and unlicensed radio frequency spectrum bands. For example, the wireless communications system 100 may employ License Assisted Access (LAA), LTE-Unlicensed (LTE-U) radio access technology, or NR technology in an unlicensed band such as the 5 GHz industrial, scientific, and medical (ISM) band. When operating in unlicensed radio frequency spectrum bands, devices such as the base stations 105 and the UEs 115 may employ carrier sensing for collision detection and avoidance. In some examples, operations in unlicensed bands may be based on a carrier aggregation configuration in conjunction with component carriers operating in a licensed band (e.g., LAA). Operations in unlicensed spectrum may include downlink transmissions, uplink transmissions, P2P transmissions, or D2D transmissions, among other examples.

A base station 105 or a UE 115 may be equipped with multiple antennas, which may be used to employ techniques such as transmit diversity, receive diversity, multiple-input multiple-output (MIMO) communications, or beamforming. The antennas of a base station 105 or a UE 115 may be located within one or more antenna arrays or antenna panels, which may support MIMO operations or transmit or receive beamforming. For example, one or more base station antennas or antenna arrays may be co-located at an antenna assembly, such as an antenna tower. In some examples, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations. Additionally or alternatively, an antenna panel may support radio frequency beamforming for a signal transmitted via an antenna port.

The base stations 105 or the UEs 115 may use MIMO communications to exploit multipath signal propagation and increase the spectral efficiency by transmitting or receiving multiple signals via different spatial layers. Such techniques may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream and may carry bits associated with the same data stream (e.g., the same codeword) or different data streams (e.g., different codewords). Different spatial layers may be associated with different antenna ports used for channel measurement and reporting. MIMO techniques include single-user MIMO (SU-MIMO), where multiple spatial layers are transmitted to the same receiving device, and multiple-user MIMO (MU-MIMO), where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105, a UE 115) to shape or steer an antenna beam (e.g., a transmit beam, a receive beam) along a spatial path between the transmitting device and the receiving device. Beamforming may be achieved by combining the signals communicated via antenna elements of an antenna array such that some signals propagating at particular orientations with respect to an antenna array experience constructive interference while others experience destructive interference. The adjustment of signals communicated via the antenna elements may include a transmitting device or a receiving device applying amplitude offsets, phase offsets, or both to signals carried via the antenna elements associated with the device. The adjustments associated with each of the antenna elements may be defined by a beamforming weight set associated with a particular orientation (e.g., with respect to the antenna array of the transmitting device or receiving device, or with respect to some other orientation).

A base station 105 or a UE 115 may use beam sweeping techniques as part of beam forming operations. For example, a base station 105 may use multiple antennas or antenna arrays (e.g., antenna panels) to conduct beamforming operations for directional communications with a UE 115. Some signals (e.g., synchronization signals, reference signals, beam selection signals, or other control signals) may be transmitted by a base station 105 multiple times in different directions. For example, the base station 105 may transmit a signal according to different beamforming weight sets associated with different directions of transmission. Transmissions in different beam directions may be used to identify (e.g., by a transmitting device, such as a base station 105, or by a receiving device, such as a UE 115) a beam direction for later transmission or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based on a signal that was transmitted in one or more beam directions. For example, a UE 115 may receive one or more of the signals transmitted by the base station 105 in different directions and may report to the base station 105 an indication of the signal that the UE 115 received with a highest signal quality or an otherwise acceptable signal quality.

In some examples, transmissions by a device (e.g., by a base station 105 or a UE 115) may be performed using multiple beam directions, and the device may use a combination of digital precoding or radio frequency beamforming to generate a combined beam for transmission (e.g., from a base station 105 to a UE 115). The UE 115 may report feedback that indicates precoding weights for one or more beam directions, and the feedback may correspond to a configured number of beams across a system bandwidth or one or more sub-bands. The base station 105 may transmit a reference signal (e.g., a cell-specific reference signal (CRS), a channel state information reference signal (CSI-RS)), which may be precoded or unprecoded. The UE 115 may provide feedback for beam selection, which may be a precoding matrix indicator (PMI) or codebook-based feedback (e.g., a multi-panel type codebook, a linear combination type codebook, a port selection type codebook). Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115) or for transmitting a signal in a single direction (e.g., for transmitting data to a receiving device).

A receiving device (e.g., a UE 115) may try multiple receive configurations (e.g., directional listening) when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets (e.g., different directional listening weight sets) applied to signals received at multiple antenna elements of an antenna array, or by processing received signals according to different receive beamforming weight sets applied to signals received at multiple antenna elements of an antenna array, any of which may be referred to as "listening" according to different receive configurations or receive directions. In some examples, a receiving device may use a single receive configuration to receive along a single beam direction (e.g., when receiving a data signal). The single receive configuration may be aligned in a beam direction determined based on listening according to different receive configuration directions (e.g., a beam direction determined to have a highest signal strength, highest signal-to-noise ratio (SNR), or otherwise acceptable signal quality based on listening according to multiple beam directions).

The UEs 115 and the base stations 105 may support retransmissions of data to increase the likelihood that data is received successfully. Hybrid automatic repeat request (HARQ) feedback is one technique for increasing the likelihood that data is received correctly over a communication link 125. HARQ may include a combination of error detection (e.g., using CRC), forward error correction (FEC), and retransmission (e.g., automatic repeat request (ARQ)). HARQ may improve throughput at the medium access control (MAC) layer in poor radio conditions (e.g., low signal-to-noise conditions). In some examples, a device may support same-slot HARQ feedback, where the device may provide HARQ feedback in a specific slot for data received in a previous symbol in the slot. In other cases, the device may provide HARQ feedback in a subsequent slot, or according to some other time interval.

In some implementations of the present disclosure, a first device, such as a base station 105, may transmit a signal including a number of error detection values (e.g., error detection bits, such as parity bits) interleaved with a number of information values (e.g., information bits, such as payload bits), where the signal is encoded with a polar code. In some cases, the base station 105 may interleave and encode the error detection bits and the information bits with a polar code as part of an encoding process such that each error detection bit corresponds to a subset of the number of information bits. For example, each error detection bit included in the signal may be used by a second device, such as a UE 115, to perform an error check (e.g., a parity check) associated with a subset of information bits which, if successful, may indicate to the receiving device that the subset of information bits were received successfully.

The UE 115 may receive the signal including the number of error detection bits interleaved with the number of information bits in a communication channel and the UE 115 may decode and deinterleave the signal (e.g., as part of a decoding operation of the signal). In some examples, the decoding operation of the signal may include decoding (e.g., successive cancelation decoding, such as with a polar code) the signal and deinterleaving a first set of information bits in the signal from an error detection bit and progressively calculating an expected error detection bit associated with the first set of information bits. In some cases, progressively calculating an expected error detection bit may reduce latency compared to some error detection techniques that may be implemented after the entire signal is received (e.g., when implemented with polar encoded signals). For example, linear-feedback shift register (LFSR) based techniques may be implemented with polar encoded signals and may be implemented to calculate one or more expected error detection bits after the entire signal is received. For instance, LFSR-based techniques, and other similar techniques, may calculate an expected error detection bit after decoding and deinterleaving the entire signal and, accordingly, such techniques may prevent early-termination of the decoding process if an error is detected (e.g., because the entire signal has already been decoded prior to detecting the error). Techniques are provided, at least in some aspects, to enable continuous error detection procedures on signals that have been encoded with polar codes and, likewise, that may be decoded with polar decoding (e.g., or any method of successive cancelation decoding).

In some implementations, the UE 115 may store one or more coefficients used for the error detection procedure. When decoding the signal, the UE 115 may use the stored coefficients to perform the error detection procedures and implement early-termination procedures. The UE 115 may identify a set of coefficients associated with the set of information bits as part of calculating the expected error detection bit. In some cases, the set of coefficients may be based on the index values associated with the first set of information bits. The UE 115 may use the set of coefficients to calculate the expected error detection bit. In some examples, the UE 115 may compare the calculated expected error detection bit to an error detection bit received in the signal.

In some examples, the UE 115 may determine that the second error detection bit received in the signal is different than the expected error detection bit. In such examples, the UE 115 may determine that the first set of information bits were received erroneously (e.g., that there is an error in one or more of the first set of information bits). Based on determining the first set of information bits were received incorrectly, the UE 115 may determine that the entire signal may be corrupted by the error in the first set of information bits. Accordingly, the UE 115 may terminate the decoding operation of the signal. In some examples, this may enable the UE 115 to perform an early termination of the decoding operation, which may result in fewer decoding cycles at the UE 115 and, likewise, faster processing timelines and lower power consumption compared to a device that decodes the entire signal prior to determining that the signal was received incorrectly.

Figure 2:
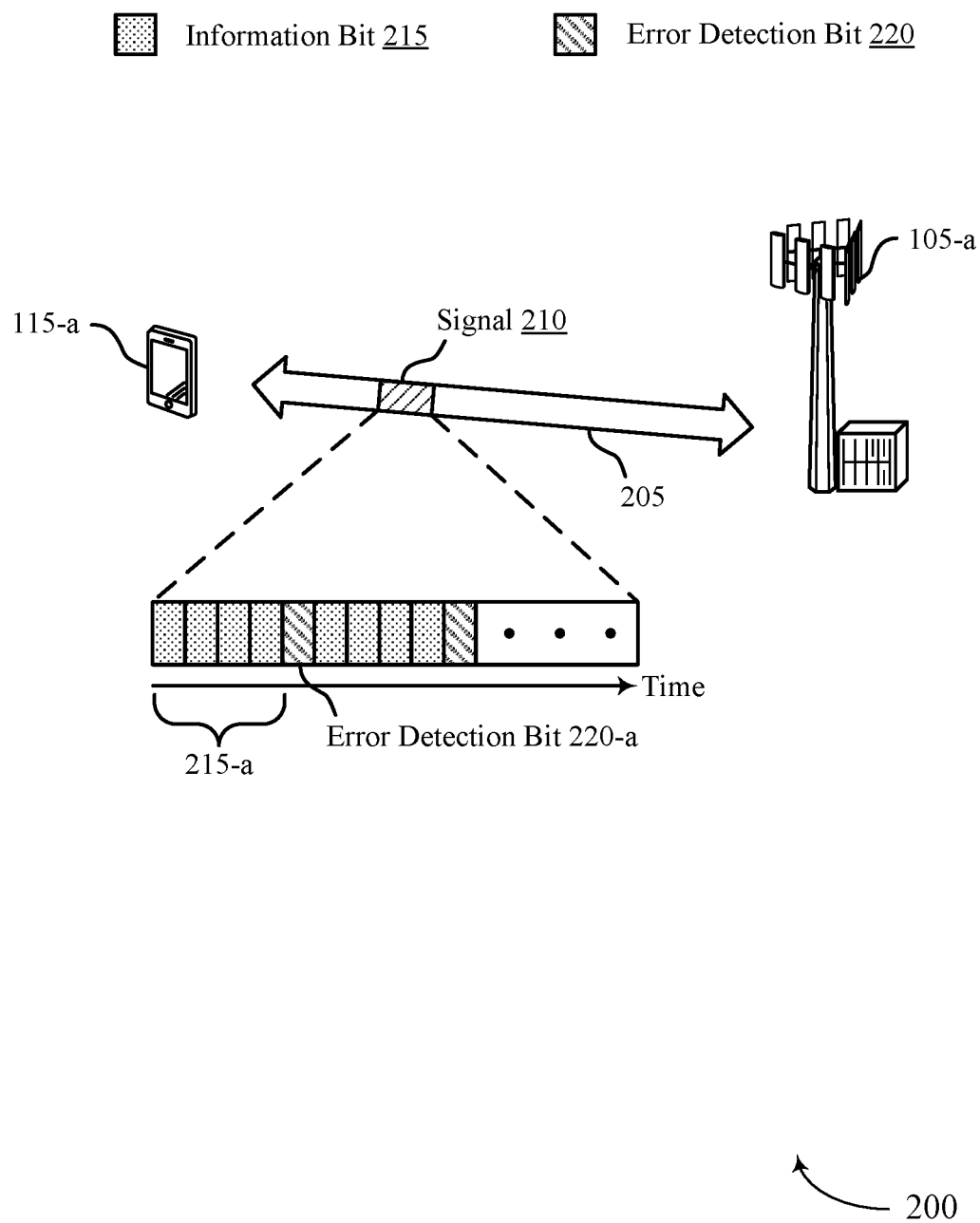
FIG. 2 illustrates an example of a wireless communications system that supports error detection for a wireless channel in accordance with aspects of the present disclosure.

FIG. 2 illustrates an example of a wireless communications system 200 that supports error detection for a wireless channel in accordance with aspects of the present disclosure, in particular of any of the previous and following examples. In some examples, wireless communications system 200 may implement aspects of wireless communications system 100. Wireless communications system 200 may include a base station 105-a and a UE 115-a, which may be examples of the corresponding devices described with reference to FIG. 1. The base station 105-a and the UE 115-a may communicate using a communication channel 205, which may be a downlink control channel, a broadcast channel, or any other suitable wireless channels that support communications between a base station 105-a and a UE 115-a. In some examples, the base station 105-a may transmit a signal 210 to the UE 115-a and the UE 115-a may progressively perform error checks associated with the information or the payload included in the signal 210. In some aspects, the data information or payload of the signal 210 may include sets of information values, such as sets of information bits 215. The UE 115-a may progressively perform the error checks associated with the information bits 215 included in the signal 210 and, in some specific examples, may terminate decoding the signal 210 (e.g., may terminate a decoding operation associated with decoding the signal 210) prior to decoding the entire signal 210 based on detecting an error in the signal 210.

The base station 105-a may transmit a signal 210 to the UE 115-a including a number of information bits 215 (e.g., the information values associated with the data information or payload of the signal 210). In some cases (e.g., if the number or size of the information bits 215 in the signal 210 is greater than a threshold number, such as 12 bits), the base station 105-a may determine to enable an error detection computation. Based on enabling the error detection computation, the base station 105-a may include error detection information in the signal 210 that the UE 115-a may use to determine whether the signal 210 is received correctly. In some aspects, the error detection information may include a number of error detection values, such as a number of error detection bits 220. Accordingly, the UE 115-a may use the number of error detection values (e.g., the number of error detection bits 220) to perform error detection computations and determine whether the signal 210 is received correctly. In some cases, an error detection bit 220 may be a CRC parity bit or a CRC bit and, likewise, the error detection computation may be a CRC parity bit computation, a CRC error check, and the like. Each error detection bit 220 of the number of error detection bits 220 included in the signal 210 may be associated with a number of information bits 215. For example, a first error detection bit 220-a may be associated with a first set of information bits 215-a such that a receiving device, such as the UE 115-a, may use the first error detection bit 220-a to determine if an error has occurred in one or more of the first set of information bits 215-a. Similarly, a second error detection bit 220 may be associated with a second set of information bits 215, and so on throughout the signal 210.

In some cases, the base station 105-a may apply one or more identifier masks (e.g., one or more radio network temporary identifier (RNTI) scrambling masks) to the number of error detection bits 220. The resultant bits may be attached to the number of information bits 215 included in the signal 210 and the base station 105-a may interleave the number of error detection bits 220 with the number of information bits 215. As such, the number of error detection bits 220 may be distributed amongst the number of information bits 215. In some cases, the number of error detection bits 220 may be distributed among sets of interleaved information bits 215. For example, the number of information bits 215 may be transmitted in an interleaved order and sets of interleaved information bits 215 may be separated by an error detection bit 220. In some cases, a first set of information bits 215-a may be associated with an error detection bit 220-a and the base station 105-a may transmit the error detection bit 220-a after the first set of information bits 215-a. For instance, an interleaver at the base station 105-a may group bits such that a set of information bits 215 is received prior to an error detection bit 220 corresponding to the set of information bits. The base station 105-a may encode the interleaved signal 210. In some cases, the base station 105-a may polar encode the signal 210 based on a polar encoding operation or a polar encoder. The base station 105-a may transmit the interleaved and encoded signal 210 in communication channel 205 to the UE 115-a.

The UE 115-a may receive the signal 210 and begin a decoding operation associated with receiving the signal 210. In some cases, a polar decoder at the UE 115-a may identify a number of log-likelihood ratios (LLRs) and may generate a number of hard decision (HD) bits. In some cases, the UE 115-a may de-interleave the HD bits to separate the sets of information bits 215 from the error detection bits 220. The UE 115-*a* may perform an error detection computation based on the sets of information bits 215 and the error detection bits 220. In some cases, the UE 115-*a* may process the information bits 215 to calculate a number of expected error detection bits. For example, the UE 115-*a* may process the information bits 215 based on an order of reception (e.g., sequentially) employing a LFSR structure to calculate the expected error detection bits based on the information bits 215. Based on the processing, the UE 115-*a* may calculate a number of bits associated with the received information bits 215 and may apply an identifier mask (e.g., an RNTI scrambling mask) to the calculated bits. The result may be associated with one or more expected error detection bits and the UE 115-*a* may compare the one or more expected error detection bits to one or more error detection bits 220 received in the signal 210 to detect if there is an error in the signal 210.

For example, if the result calculated by the UE 115-*a* does not match one or more of the received error detection bits 220, the UE 115-*a* may determine that an error has occurred in either the reception or the transmission of the signal 210 or that the signal 210 is not meant for the UE 115-*a*. In some cases, a difference may indicate that there is an error in one or more of the information bits 215 received in the signal 210. Additionally or alternatively, a difference between the expected error detection bits 220 and the received error detection bits 220 may be realized when the UE 115-*a* uses a different identifier mask than the identifier mask used by the base station 105-*a*. In some cases, the UE 115-*a* may attempt to blind decode the communication channel 205 (e.g., if the communication channel 205 is a downlink control channel) by applying different identifier masks from a set of identifier masks stored at the UE 115-*a* to the calculated one or more error detection bits 220. In cases when none of the identifier masks with which the UE 115-*a* is configured results in a successful error detection computation (e.g., a successful error check), the UE 115-*a* may determine that the signal 210 was either received incorrectly or that the signal 210 was meant for a different UE 115 other than UE 115-*a*.

The LFSR-based error detection may be performed on the decoded (e.g., polar decoded) information bits 215 upon completion of a decoding operation of the signal 210. Accordingly, this may result in some latency at the UE 115-*a* because all of the information bits 215 are decoded, collected, and de-interleaved prior to performing error detection. In some cases, the processing power of a hardware structure performing LFSR-based error detection may inadequately shorten the processing timeline of LFSR-based error detection methods (e.g., the final error detection computation using an LFSR-based method may take up to 1 microsecond for each carrier of the signal 210). Additionally, when using an LFSR-based error detection method implemented with polar decoding, the UE 115-*a* may be unable to terminate a decoding operation of the signal 210 prior to completing the decoding operation because the entire signal 210 is decoded prior to performing the LFSR-based error detection computation.

In some implementations of the present disclosure, the UE 115-*a* may progressively perform error detection computations (e.g., as the signal 210 is decoded and deinterleaved). As described herein, a number of error detection bits 220 may be interleaved with a number of information bits 215. In some cases, each error detection bit 220 of the number of error detection bits 220 included in the signal 210 may be associated with a set of information bits 215. For example, the UE 115-*a* may use each error detection bit 220 to determine whether an associated set of information bits 215 are received correctly. The base station 105-*a* may interleave each information bit 215 of a set of information bits 215 associated with an error detection bit 220 in a way that may place at least some information bits 215 of the set of information bits 215 in front of (e.g., prior to) the error detection bit 220 associated with the set of information bits 215. In other words, the UE 115-*a* may receive (e.g., decode and de-interleave) a first set of information bits 215-*a* corresponding to the first error detection bit 220-*a* prior to receiving the first error detection bit 220-*a*. Aspects of the described techniques may be implemented to take advantage of such interleaving and may enable the UE 115-*a* to compare a received error detection bit 220 to an expected error detection bit 220 without waiting to receive any information bits 215 associated with the error detection bit 220 after the error detection bit 220 is received. Accordingly, the UE 115-*a* may begin an error check once the error detection bit 220 is received.

In some implementations, the UE 115-*a* may support lower latency decoding operations or early termination of a decoding operation based on performing error detection computations concurrently with decoding the signal 210 (e.g., on-the-fly), when the signal 210 was encoded using a polar code. In some examples, the UE 115-*a* may identify or determine an index value of each information bit 215 of the first set of information bits 215-*a* and may identify a coefficient associated with the index value of each information bit 215. The UE 115-*a* may store the coefficients in a memory and may retrieve the coefficients based on the identified index value. In some cases, the coefficients associated with a set of information bits 215 may be defined by the coefficients of the operation of Equation 1 below.

$$r(x) = a(x)x^n \bmod g(x) = \qquad (1)$$

$$(a_0 + a_1 x + \ldots + a_{m-1} x^{m-1}) x^n \bmod g(x) = \sum_{i=0}^{m-1} a_i x^{n+i} \bmod g(x)$$

In some cases, $r(x)$ may be a remainder, $g(x)$ may be a polynomial (e.g., a CRC generator polynomial), n may be the order of the polynomial, m may be the number of information bits 215, $a_i$ may be the value of an information bit 215 (e.g., 0 or 1), i may be the index value of the information bits 215, and mod may be a modulo operator.

In some cases, the coefficients may reduce to Equation 2 below.

$$\text{coefficients} = x^{n+i} \bmod g(x); i = 0, 1, \ldots, m-1 \qquad (2)$$

In some examples, the UE 115-*a* may use a set of coefficients associated with the first set of information bits 215-*a* to calculate an expected error detection bit 220. For example, the UE 115-*a* may receive the first set of information bits 215-*a* and may compute an expected error detection bit 220 based on the coefficients associated with the first set of information bits 215-*a* (e.g., associated with the index values of the first set of information bits 215-*a*). In some examples, the UE 115-*a* may compute the expected error detection bit 220 based on the coefficients associated with the first set of information bits 215-*a* and an identifier mask stored at the UE 115-*a*. The UE 115-*a* may receive an error detection bit 220-*a* in the signal 210 associated with the first set of information bits 215-*a* and may compare the received error detection bit 220-*a* with the calculated error detection bit 220 as part of an error check.

In some implementations, the UE 115-*a* may determine that the received error detection bit 220-*a* and the calculated error detection bit 220 are different. Accordingly, the UE 115-*a* may determine that one or more of the first set of information bits 215-*a* were received incorrectly and may terminate the decoding operation of the signal 210 before completing the decoding operation (e.g., decoding and de-interleaving the entire signal 210). As such, the UE 115-*a* may perform fewer decoding cycles and spend a longer time in a sleep mode (e.g., a micro-sleep mode), which may result in reduced power consumption at the UE 115-*a*.

Figure 3:
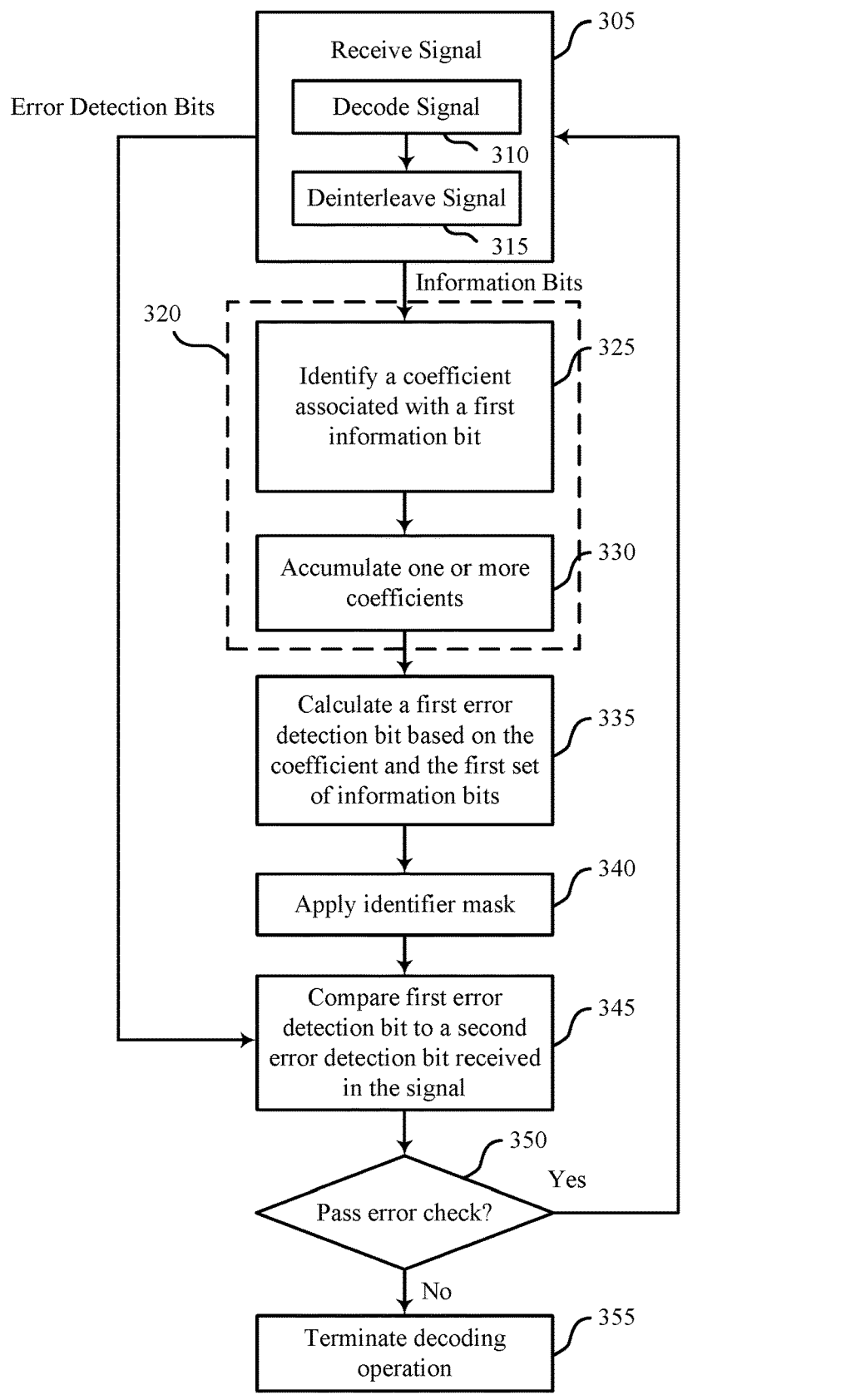
FIG. 3 illustrates an example of a process flow that supports error detection for a wireless channel in accordance with aspects of the present disclosure.

FIG. 3 illustrates an example of a process flow 300 that supports error detection for a wireless channel in accordance with aspects of the present disclosure, in particular of any of the previous and following examples. In some examples, process flow 300 may implement aspects of wireless communications systems 100 or 200. Process flow 300 may include a number of operations performed by a device in accordance with the techniques described herein. In some examples, process flow 300 may illustrate an example of hardware (e.g., including circuitry, processing blocks, logic components, and other components) that may perform the operations of process flow 300. For example, process flow 300 may include procedures performed by a device, such as a UE 115, that receives a signal from another device, such as a base station 105.

At 305, the device may receive a signal. In some examples, the signal may include error detection information, which may include a number of error detection values or a number of error detection bits. with the signal may also include data information or a payload, which may include a number of information values or a number of information bits. In some aspects, the number of error detection values (e.g., the number of error detection bits) may be interleaved with the number of information values (e.g., the number of information bits). Additionally or alternatively, the signal may be encoded (e.g., polar encoded). In some examples, receiving the signal may include performing a decoding operation of the signal, which may include a decoding procedure and a deinterleaving procedure. For instance, receiving the signal at 305 may further include decoding the signal at 310 and deinterleaving the signal at 315. In some cases, the device may receive (e.g., decode and deinterleave) a single bit at a time. In some other cases, the device may receive a number of bits (e.g., a batch of bits) together.

At 310 the device may decode (e.g., polar decode) the signal. In some implementations, the device may progressively decode the signal using the polar code to identify an information bit (or a batch of information bits) of the number of information bits or an error detection bit of the number of error detection bits.

In some cases, the device may perform decoding based on a successive cancellation decoding procedure and the number of bits in the signal may be decoded progressively. For example, in polar decoding, a first bit (or a first batch of bits) may be decoded, then a second bit (or a second batch of bits) may be decoded based on completing the polar decoding of the first bit (or the first batch of bits), and so on until the signal is completely decoded or the decoding operation of the signal is terminated.

At 315, the device may deinterleave the signal. In some implementations, the device may deinterleave an error detection bit from the number of information bits included in the signal. In some implementations, based on deinterleaving the signal, the device may reorder the number of information bits in the signal such that sets of information bits that are associated with the same error detection bit may be grouped together (e.g., in a successive or consecutive order). For example, a first set of information bits associated with a first error detection bit may be grouped together and a second set of information bits associated with a second error detection bit may be grouped together and may follow the first set of information bits. In some examples, the UE 115 may receive (e.g., decode and de-interleave) the signal and may progressively use information bits to calculate an expected error detection bit as part of an error detection method.

At 320, the device may identify a coefficient associated with an information bit. In some examples, the device may identify a coefficient based on an index value associated with a first information bit. The index value may be associated with an original index value of the information bit, an interleaved index value, or a deinterleaved index value.

At 325, the device may identify a coefficient for the first information bit. In some cases, the coefficient is identified based on an index value for the first information bit. In some cases, a coefficient associated with an information bit may be determined based on Equation 2. In some implementations, the device may pre-calculate the coefficients according to Equation 2 and store the coefficients in a memory of the device (e.g., in a look up table (LUT) at the device). In some examples, the LUT may have m rows and n columns, where m is the number of information bits in the signal and n is the order of the CRC generator polynomial. In some cases, a signal may include up to 140 information bits and the CRC generator polynomial may have an order up to 24. As such, a single 140×24 LUT may be sufficiently large to store the coefficients for a quantity of possible signals. The device may identify or determine an index value for an information bit and identify a corresponding location in the LUT based on the identified index value that includes the coefficient associated with the information bit.

At 330, the device may store the coefficient identified in the memory (e.g., the coefficient associated with the information bit) in an accumulator. In some specific implementations, the device may progressively identify a coefficient for each information bit of a first set of information bits as the first set of information bits are received and store each coefficient in the accumulator (e.g., the accumulator may include a continuous sum of the identified coefficients).

At 335, the device may calculate a first error detection bit based on the accumulated coefficients and the first set of information bits. In some examples, the first error detection bit may be progressively computed based on progressively accumulating the coefficients in the accumulator. For example, the device may continuously calculate the first error detection bit based on the most recently received (e.g., decoded and deinterleaved) information bit. As such, approximately as soon as an error detection bit is received the device may determine whether the signal has been received correctly (e.g., the continuously calculated first error detection bit will be equal to the received error detection bit at approximately the time when the error detection bit is received).

At 340, the device may apply one or more identifier masks to the calculated first error detection bit. The device may use the identifier mask as part of a blind decoding procedure (e.g., when the signal is transmitted in a downlink control channel) so that the device may determine if the signal was meant for the device. For instance, the signal may be associated with a first identifier mask (e.g., based on a transmitting device applying the first identifier mask). The device may apply one or more identifier masks that are known to the device (e.g., configured on the device) and the device may perform the blind decoding procedure successfully if the device is configured with and applies the first identifier mask. In some cases, the identifier mask may be a scrambling mask, such as an RNTI scrambling mask. Additionally or alternatively, the device may be configured with one or more identifier masks by higher layer signaling.

At 345, the device may compare the calculated first error detection bit to the received error detection bit associated with the first set of information bits in the signal. In some implementations, the device may determine that the calculated first error detection bit and that the received error detection bit are different. Accordingly, at 350, the device may determine that one or more of the first set of information bits may be incorrectly received. In such examples, the device may terminate the decoding operation of the signal at 355.

In some other implementations, the device may determine that the calculated first error detection bit is the same as the received error detection bit. Accordingly, at 350, the device may determine that the error check passed and that the one or more information bits of the first set of information bits. Based on passing the error check at 350, the device may continue to progressively receive (e.g., decode and de-interleave) the signal at 305.

Figure 4:
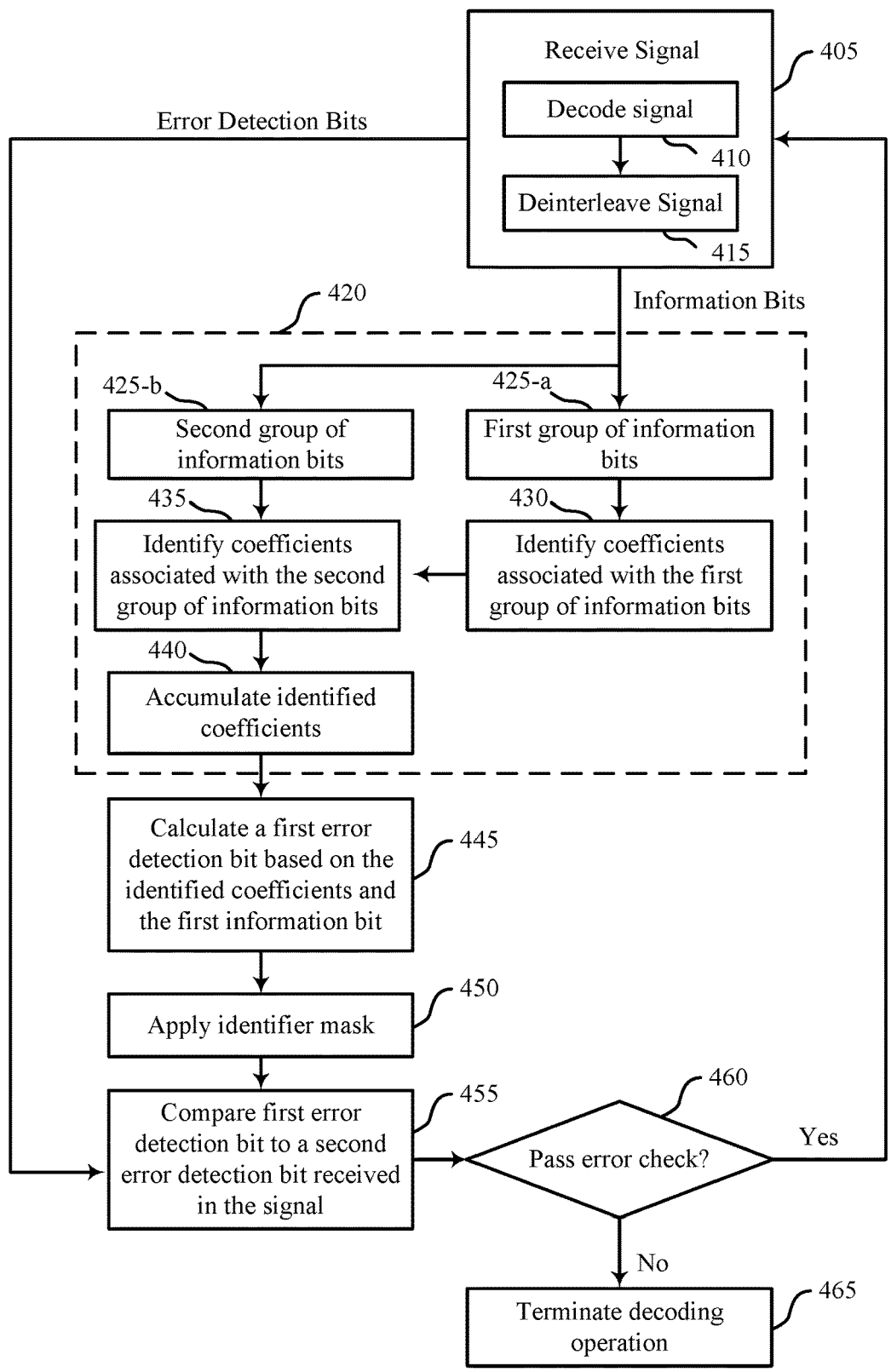
FIG. 4 illustrates an example of a process flow that supports error detection for a wireless channel in accordance with aspects of the present disclosure.

FIG. 4 illustrates an example of a process flow 400 that supports error detection for a wireless channel in accordance with aspects of the present disclosure, in particular of any of the previous or following examples. In some examples, process flow 400 may implement aspects of wireless communications systems 100 or 200. The process flow 400 may illustrate operations at a device, such as a UE 115 as described with reference to FIG. 1.

In some examples, a smaller, reduced-size, or down-sampled LUT may be used to output coefficients associated with a subset of the index values of the information bits (e.g., the information values) in the signal (e.g., a subset of index values of the total number of index values, such as indicated by a specification). In some specific examples, the LUT may be a down-sampled version of the LUT as described with reference to FIG. 3. As such, the down-sampled LUT may include fewer table entries and use less memory of the device. For instance, an application-specific integrated circuit (ASIC) may be employed to perform one or more aspects of the present disclosure and, in some cases, reducing the size of the LUT may reduce the amount of area that the ASIC may use or a memory associated with the ASIC or LUT may use to store the LUT. Accordingly, in some cases, the ASIC may use less material to construct the memory (e.g., silicon).

Reducing the size of the memory, however, may result in one or more values being missing from the memory (e.g., missing from the LUT). For example, one or more entries in the LUT (e.g., corresponding to index values of one or more information bits or values) may not have a stored coefficient (e.g., the device may not store a pre-calculated coefficient for a subset of index values when using a reduced-size LUT). Accordingly, when the device decodes and deinterleaves an information bit with an index value corresponding to an empty entry in the LUT, the device may compute any missing coefficient concurrently with the decoding operation of the signal (e.g., on-the-fly) using one or more algorithms to interpolate the value of the coefficient.

In some examples, when using the reduced-size memory, the coefficients may be computed or determined based on Equation 3 below.

$$r(x) = \sum_{i=0}^{m-1} a_i x^{n+i} \bmod g(x) = \sum_{i=0}^{\frac{m}{2^k}-1} \sum_{j=0}^{2^k-1} a_{(2^k \times i + j)} (x^{n+(2^k \times i + j)}) \bmod g(x) = \quad (3)$$

$$\sum_{i=0}^{\frac{m}{2^k}-1} \sum_{j=0}^{2^k-1} a_{(2^k \times i + j)} (x^j x^{n+(2^k \times i)}) \bmod g(x) =$$

$$\sum_{i=0}^{\frac{m}{2^k}-1} \sum_{j=0}^{2^k-1} a_{(2^k \times i + j)} (x^j \cdot (x^{n+(2^k \times i)} \bmod g(x))) \bmod g(x)$$

In some cases, $2^k$ is a down-sampling factor and k may be a predetermined or preconfigured value. In some cases, i may be an integer from 0 to $$\frac{m}{2^k} - 1$$

and j may be an integer from 0 to $2^k-1$. Process flow 400 may illustrate an example method for how the device may receive a signal and identify which index values of information bits have coefficients (e.g., pre-calculated coefficients) included in the memory and which index values of information bits the device may compute coefficients for. In some examples, process flow 400 may additionally illustrate an example of hardware (e.g., including circuitry, processing blocks, logic components, and other components) that may perform the operations of process flow 400.

At 405, the device may receive a signal (e.g., from a transmitting device, such as a base station 105) over a communication channel (e.g., a downlink control channel). In some cases, the signal may include error detection information, which may include a number of error detection values, such as a number of error detection bits. The signal may also include data information or a payload, which may include a number of information values, such as a number of information bits. In some aspects, the number of error detection values (e.g., the number of error detection bits) may be interleaved with the number of information values (e.g., the number of information bits) and the signal may be encoded (e.g., polar encoded). In some examples, receiving the signal may include performing a decoding operation of the signal, which may include a decoding procedure and a de-interleaving procedure. For instance, receiving the signal at 405 may further include decoding the signal at 410 and de-interleaving the signal at 415. In some cases, the device may receive (e.g., decode and deinterleave) a single bit (e.g., a single value) at a time. In some other cases, the device may receive a number of bits or a number of values (e.g., a batch of bits or a batch of values) together.

At 410, the device may decode (e.g., polar decode) the signal. In some cases, the decoding at 410 may be similar to the decoding at 310, as described with reference to FIG. 3. For example, in some implementations, the device may progressively decode the signal using the polar code to identify an information bit (or a batch of information bits) of the number information bits in the signal or an error detection bit of the number of error detection bits in the signal.

At 415, the device may deinterleave the signal. In some cases, the decoding at 415 may be similar to the decoding at 315, as described with reference to FIG. 3. For example, in some implementations, the device may identify an error detection bit at 410 and may deinterleave the error detection bit from the number of information bits. Additionally or alternatively, the device may deinterleave one or more information bits.

At 420, the device may identify a coefficient associated with an information bit of the signal. In some examples, the device may use the coefficient to calculate an error detection bit associated with the information bit. The device may progressively identify a coefficient for each information bit of the signal as the signal is decoded. For example, the device may decode a first information bit at 410 and may identify the coefficient associated with the first information bit at 420.

In some implementations, the device may identify a coefficient associated with an information bit using the reduced-size memory. Accordingly, the device may identify a coefficient associated with an information bit from the memory (e.g., when a first index value of the information bit corresponds to a pre-calculated coefficient in the memory) or may calculate the coefficient (e.g., when the first index value of the information bit corresponds to a missing value in the memory).

At 425, the device may determine whether the information bit (e.g., the first index value of the information bit) corresponds to a pre-calculated coefficient stored in a memory (e.g., in the LUT). In some examples, the device may identify that the information bit belongs to a first group of information bits associated with pre-calculated coefficients stored in the memory. In some other examples, the device may identify that the information bit belongs to a second group of information bits without pre-calculated coefficients stores in the memory (e.g., associated with empty or missing entries in the LUT in the memory). In some implementations, the device may identify that the information bit belongs to the first group of information bits or the second group of information bits based on the size of the memory. For example, the device may determine whether the memory is a reduced-size memory or includes a down-sampled LUT, or both. In some specific examples, the device may determine that the information bit belongs to the first group of information bits or the second group of information bits based on a down-sampling factor associated with the reduced-size memory or down-sampled LUT.

At 425-a, the device may determine that the information bit belongs to the first group of information bits. In some examples, the device may determine that the information bit belongs to the first group of information bits if the down-sampling factor divides evenly into the first index value (e.g., when a remainder of the division is zero). In some implementations, the device may identify a second index value associated with the information bit based on the first index value of the information bit to determine that the information bit belongs to the first group of information bits. For example, in some specific implementations, the entries of the reduced-size memory (e.g., including a down-sampled LUT) may be different than the entries of the complete memory (e.g., including a complete LUT, such as a 140×24 LUT). For instance, the reduced-size memory may include the number of entries of the complete memory divided by the down-sampling factor (e.g., $2^k$) In some cases, the size of the memory may be reduced to include entries that include coefficients, where entries that would not include a coefficient (e.g., after down-sampling) are removed from the memory. In such cases, the first index value of the information bit may correspond to a different coefficient (e.g., an incorrect coefficient) in the reduced-size memory than in the full-size memory or may not correspond to an entry (e.g., when the first index of the information bit is greater than the size of the down-sampled LUT included in the reduced-size memory).

Accordingly, the device may identify or determine a second index value based on the first index value, the down-sampling factor, and an operation (e.g., a mathematical operation) that may correspond to the correct entry (e.g., the correct coefficient) in the reduced-size memory. In some examples, the device may identify or determine the second index value based on dividing the first index value by the down-sampling factor (e.g., $2^k$). At 430, the device may use the second index value to identify a coefficient (e.g., a pre-calculated coefficient) in the memory. In some examples, the coefficients included in the memory may be pre-calculated based on Equation 4 below.

$$\text{coefficients} = x^{n+(2^k \times i)} \bmod g(x);\ i = 0, 1, \ldots, \frac{m}{2^k} - 1 \qquad (4)$$

At 425-b, the device may determine that the information bit belongs to the second group of information bits. In some cases, the device may determine that the information bit belongs to the second group of information bits if there is a remainder after dividing the first index value by the down-sampling factor. Accordingly, the device may determine that the reduced-size memory may not include a coefficient (e.g., a pre-calculated coefficient) associated with the information bit and the device may calculate the coefficient instead. In some aspects, the coefficients associated with the second group of information bits may be determined based on an operation (e.g., a modulo operation) applied to the first index value of the information bit and the down-sampling factor. For example, the remainder after dividing the first index value of the information bit by the down-sampling factor (e.g., $2^k$) may correspond to a proximity value between the first index value of the information bit and one or more index values (e.g., a second index value) of one or more information bits included in the reduced-size memory.

In some examples, the remainder (e.g., the proximity value) may be a third index value. In some aspects, the third index value may be a difference between the first index value of the information bit and one or more next-closest index values (e.g., a second index value) that correspond to one or more information bits included in the reduced-size memory. In some implementations, the device may calculate the coefficient associated with the information bit based on the pre-calculated coefficients associated with the nearest one or more information bits at 435.

At 435, the device may identify (e.g., calculate) the coefficient associated with the information bit. In some aspects, the operations at 435 may be performed by a CRC generation block. In some specific implementations, the CRC generation block may take inputs of the CRC generator polynomial and the one or more coefficients of the nearest one or more information bits that are included in the memory. In some examples, the coefficient of the information bit may be calculated according to Equation 5 below.

$$(x \cdot x^{n+(2^k \times i)}) \bmod g(x)$$

$$(x^2 \cdot x^{n+(2^k \times i)}) \bmod g(x) = x \cdot (x \cdot x^{n+(2^k \times i)} \bmod g(x)) \bmod g(x) \qquad (5)$$

Additionally, the device may use similarly expanded or higher order equations related to Equation 5 to calculate the coefficients for information bits included in the second group of information bits (e.g., associated with missing coefficients in the reduced-size memory). In some cases, Equation 5 may be executed by circuit (e.g., a digital circuit) employing a simplified Galois multiplier. In such cases, the simplified Galois multiplier may compute functions associated with a mathematical form of (x·v(x)) mod g(x), as described in further detail in FIGS. 5 and 6. In some cases, the Galois multiplier may refer to a finite field with a finite number of elements that is used as part of finite field arithmetic.

At 440, the device may add the identified coefficient (e.g., either calculated or identified in the memory) associated with the information bit to an accumulator. In some cases, the accumulator may store a continuous sum of coefficients associated with information bits. As such, the accumulator may store a running (e.g., continuous, progressive, etc.) total of the coefficients associated with a number of received information bits. In some implementations, the running total of the coefficients may be used for error detection bit computation (e.g., at 445).

In some specific implementations, the device may accumulate a first number of coefficients prior to receiving (e.g., decoding and de-interleaving) an error detection bit. The device may use the accumulated first number of coefficients, at 445, to calculate an error detection bit (e.g., an expected error detection bit) associated with the first set of information bits. In some cases, the device may clear the accumulator upon the calculation at 445 in order to begin accumulating a second number of coefficients associated with a second set of information bits, the second set of information bits associated with a second error detection bit (e.g., different than the first error detection bit). In some other cases, the device may employ a number of accumulators and may accumulate the first number of coefficients in a first accumulator and the second number of coefficients in a second accumulator. In such cases, the device may support progressive error checks even when the first set of information bits associated with the first error detection bit and the second set of information bits associated with the second error detection bit overlap (e.g., when each set of information bits associated with a different error detection bit are not transmitted consecutively in the signal).

At 450, the device may apply one or more identifier masks to the computed error detection bit. The device may use the identifier mask as part of a blind decoding procedure (e.g., when the signal is transmitted in a downlink control channel) so that the device may determine if the signal was meant for the device. For instance, the signal may be associated with a first identifier mask (e.g., based on the transmitting device applying the first identifier mask). The device may apply one or more identifier masks that are known to the device (e.g., configured on the device) and the device may perform the blind decoding procedure successfully if the device is configured with and applies the first identifier mask. In some cases, the identifier mask may be a scrambling mask, such as an RNTI scrambling mask. Additionally or alternatively, the device may be configured with one or more identifier masks by higher layer signaling.

At 455, the device may compare the calculated error detection bit to an error detection bit that was received in the signal, where the calculated error detection bit was calculated based on a set of information bits associated with the received error detection bit. At 460, the device may determine whether the error check passes or fails. For instance, if the calculated error detection bit and the received error detection bit are the same, the device may determine that the error check passes and may continue receiving (e.g., decoding and de-interleaving) the signal. If the calculated error detection bit and the received error detection bit are different, the device may determine that the error check fails. Accordingly, at 465, the device may terminate the decoding operation (e.g., decoding and de-interleaving) of the signal.

In some implementations, the device may terminate the decoding operation of the signal before the decoding operation of the signal is complete (e.g., prior to decoding and de-interleaving the entire signal). This may allow the device to perform an early termination of the decoding operation based on progressively comparing a received error detection bit with a calculated error detection bit concurrently with receiving the signal. In some cases, as described herein, the error detection bits may be CRC parity bits. As such, an early termination based on the described techniques may be a CRC-based early termination.

Figure 5:
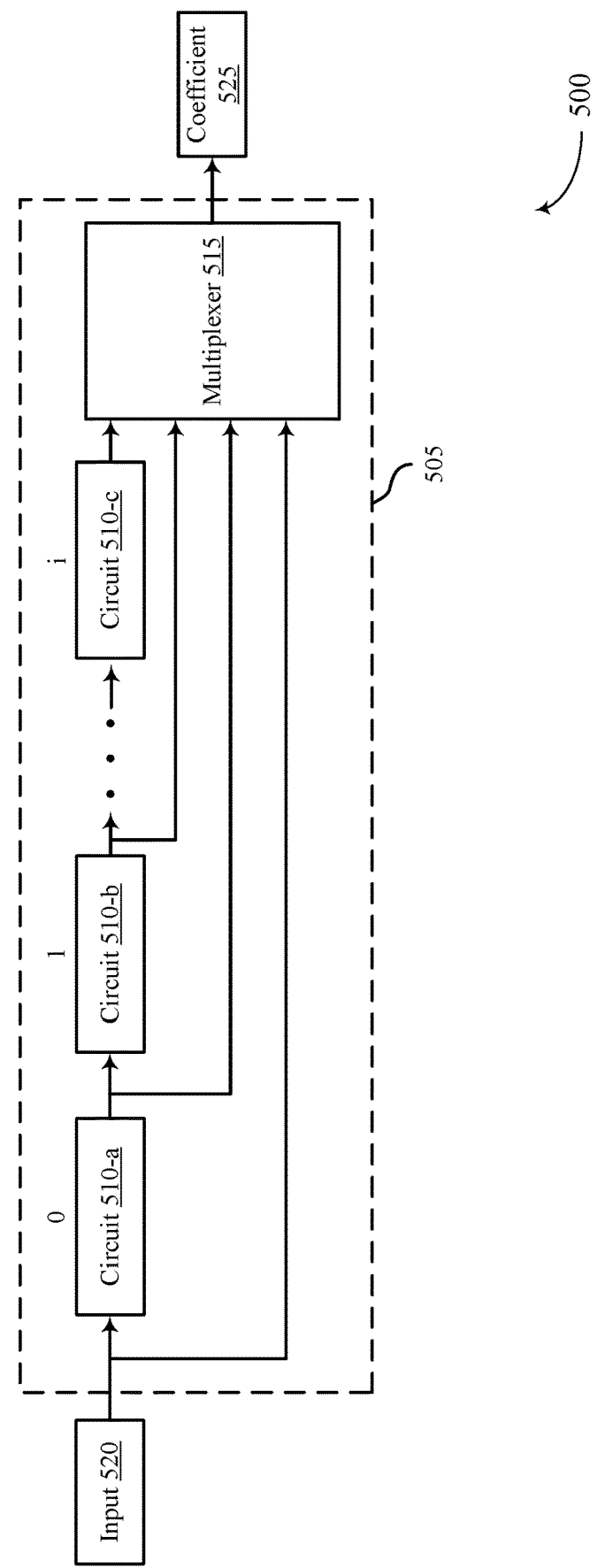
FIG. 5 illustrates an example of a circuit that supports error detection for a wireless channel in accordance with aspects of the present disclosure.

FIG. 5 illustrates an example of a circuit 500 that supports error detection for a wireless channel in accordance with aspects of the present disclosure, in particular of any of the previous and following examples. In some examples, the circuit 500 may implement aspects of wireless communications systems 100 or 200. The circuit 500 may include hardware capable of performing the operations of the techniques described herein. The circuit 500 may include a CRC generator block 505. In some examples, the CRC generator block 505 may be implemented to calculate an error detection bit associated with a set of information bits, as described in more detail in FIG. 4.

The CRC generator block 505 may include a quantity i of circuits 510, including circuit 510-*a*, circuit 510-*b*, and circuit 510-*c*, and a multiplexer 515. In some examples, the CRC generator block 505 may calculate error detection information, such as an error detection value or an error detection bit associated with data information or a payload included in the signal, such as a first information value or a first information bit. In some aspects, the first information value (e.g., the first information bit) may be associated with an index value that may not be included in a reduced-size memory (e.g., including a down-sampled LUT). In some implementations, the CRC generator block 505 may receive an input 520 including one or more coefficients associated with one or more information values (e.g., one or more information bits) that are proximate to the first information value (e.g., the first information bit). In some specific implementations, the input 520 may be a function associated with coefficients associated with information values or information bits included in the reduced-size memory. For instance, a function v(x) associated with the outputs (e.g., coefficients for error detection bit computation) of the reduced-size memory may be provided to the CRC generator block 505 and the CRC generator block 505 may calculate a coefficient associated with the first information bit based on the function v(x) and the result of a modulo operation applied to the index value of the first information bit and the down-sampling factor (e.g., where the result may include a proximity to one or more index values of information bits included in the reduced-size memory), as described in more detail in FIG. 4. In some aspects, the function v(x) may be defined by Equation 6 below.

$$v(x) = x^{n+(2^k \times i)} \bmod g(x) \quad (6)$$

In some cases, Equation 6 may be similar to (e.g., or the same as) Equation 4 when $$i = 0, 1, \ldots, \frac{m}{2^k} - 1$$

(e.g., may correspond to the coefficients that are pre-calculated and stored in the reduced-size memory when the down-sampling factor is $2^k$)

In some implementations, CRC generator block may take the input 520 and calculate a coefficient for the first information bit based on a combination of a number (e.g., i) of operations performed by circuits 510. In some cases, the circuits 510 may perform similar (e.g., or the same) operations and the number of circuits 510 used to calculate a coefficient may be based on the down sampling factor. In some specific implementations, the number of circuits 510 may be equal to the down-sampling factor minus an integer (e.g., 2). For instance, i may be equal to $2^k-2$. In some aspects, the number of circuits 510-c may be chained together (e.g., may be connected in series) and each circuit 510-c may provide an output to the multiplexer 515.

The multiplexer 515 may receive the outputs of each of the circuits 510 and, in some cases, may also receive input 520. In some implementations, the multiplexer 515 may determine the coefficient 525 associated with the first information bit based on receiving the outputs of the circuits 510. The multiplexer 515 may multiplex the outputs of the circuits 510 or otherwise interpolate the outputs to determine the coefficient 525. In some aspects, the multiplexer 515 may be associated with a down-sampling factor of a reduced-size or down-sampled memory. For example, in the case when the down-sampling factor is $2^k$, the multiplexer 515 may be a $2^k$ to 1 multiplexer. In some examples, the CRC generator block 505 may output the coefficient 525 to an accumulator, as described in more detail in FIG. 4.

Figure 6:
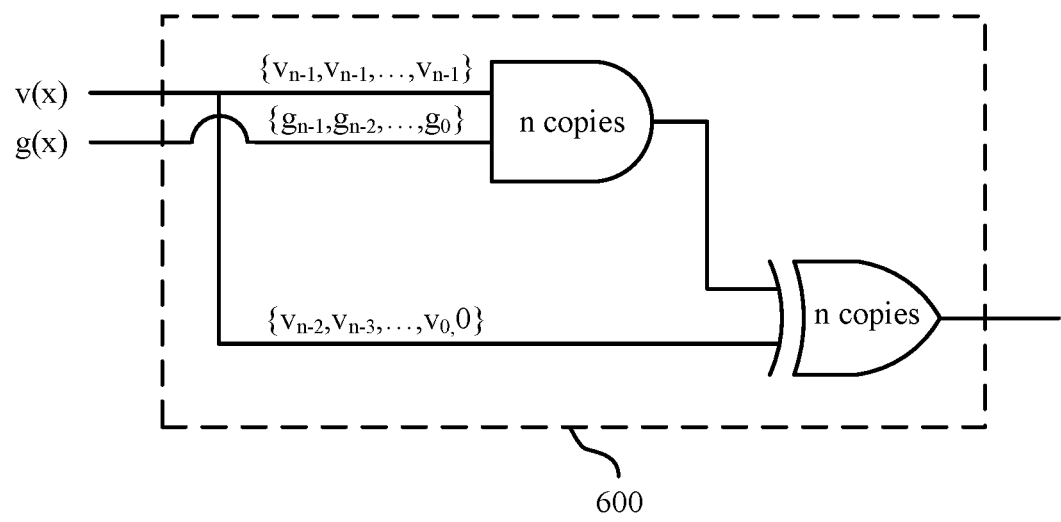
FIG. 6 illustrates an example of a circuit that supports error detection for a wireless channel in accordance with aspects of the present disclosure.

FIG. 6 illustrates an example of a circuit 600 that supports error detection for a wireless channel in accordance with aspects of the present disclosure, in particular of any of the previous and following examples. In some examples, the circuit 600 may implement aspects of wireless communications systems 100 or 200. In some examples, the circuit 600 may be an example of a circuit 510, as described with reference to FIG. 5.

The circuit 600 may have inputs of v(x) (e.g., associated with the output of coefficients in the memory) and g(x) (e.g., the CRC generator polynomial or matrix). The circuit 600 may perform operations of a simplified Galois multiplier and may be used to compute mathematical functions of the form (x·v(x)) mod g(x). In some aspects, $v(x)=v_0+v_1x+\ldots+v_{n-1}x^{n-1}$, where the order of v(x) may be less than the order of g(x). In some examples, the circuit 600 may be implemented to compute Equation 7, as shown below.

$$(x \cdot v(x)) \bmod g(x) = (c_{n-1}g_0) + (v_{n-1}g_1 + v_0)x + \ldots + (v_{n-1}g_{n-1} + v_{n-2})x^{n-1} \quad (7)$$

In some aspects, the circuit 600 may be implemented to perform a basic (e.g., simplified) mathematical operation and a number of circuits 600 may be chained together (e.g., within a CRC generator block, as described with reference to FIG. 5) to perform higher order or more complex operations. As described in more detail in FIG. 5, a number of circuits 600 (e.g., a number equal to the down-sampling factor minus 2) may be chained together to determine a coefficient associated with a first information value (e.g., a first information bit) based on the coefficients associated with one or more information values (e.g., one or more information bits) with index values proximate to the index value of the first information value. In some cases, the circuit 600 may generate a number of copies (e.g., n copies) based on the order of the CRC generator polynomial g(x).

Figure 7:
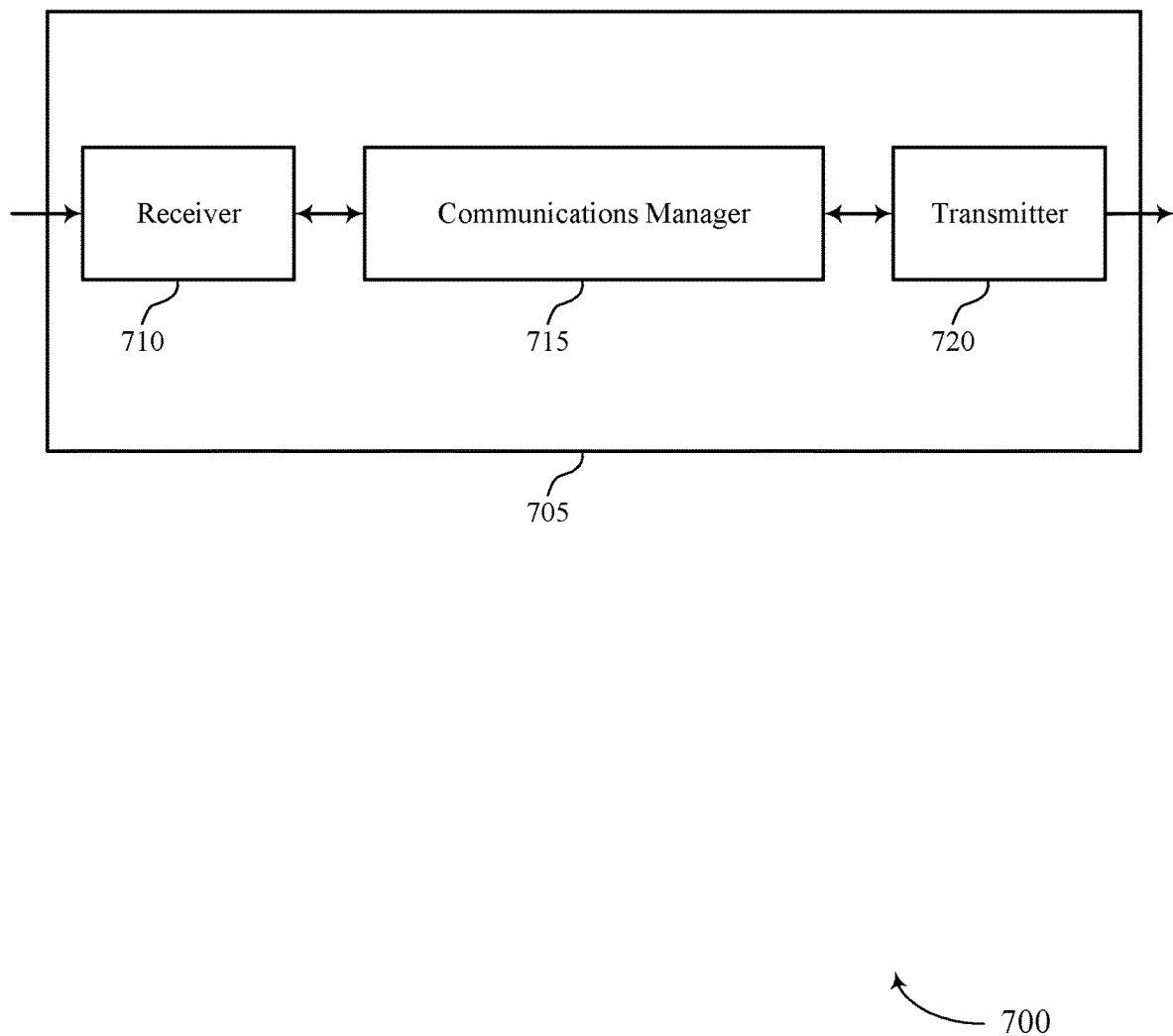
FIGS. 7 and 8 show block diagrams of devices that support error detection for a wireless channel in accordance with aspects of the present disclosure.

FIG. 7 shows a block diagram 700 of a device 705 that supports error detection for a wireless channel in accordance with aspects of the present disclosure, in particular of any of the previous and following examples. The device 705 may be an example of aspects of a UE 115 as described herein. The device 705 may include a receiver 710, a communications manager 715, and a transmitter 720. The device 705 may also include a processor. Each of these components may be in communication with one another (e.g., via one or more buses).

The receiver 710 may receive information such as packets, user data, or control information associated with various information channels (e.g., control channels, data channels, and information related to error detection method for a wireless channel, etc.). Information may be passed on to other components of the device 705. The receiver 710 may be an example of aspects of the transceiver 1020 described with reference to FIG. 10. The receiver 710 may utilize a single antenna or a set of antennas.

The communications manager 715 may receive a signal that includes a set of error detection bits interleaved with a set of information bits, identify a coefficient associated with a first information bit of the set of information bits and used for calculating at least one error detection bit based on receiving the signal, calculate the first error detection bit based on the coefficient and the first information bit, determine that a second error detection bit received in the signal and associated with the first information bit is different than the first error detection bit calculated using the coefficient and the first information bit, and terminate a decoding operation of the signal before the decoding operation is complete based on determining that the first error detection bit is different than the second error detection bit. The communications manager 715 may be an example of aspects of the communications manager 1010 described herein.

The communications manager 715 may also receive a signal that includes a set of error detection values and a set of information values, determine a coefficient, the coefficient associated with a first information value of the set of information values, configured for determining at least one error detection value, determine a first error detection value based on the coefficient associated with the first information value, determine that a second error detection value received in the signal and associated with the first information value is different than the first error detection value, and terminate decoding of the signal based on the first error detection value and the second error detection value. The communications manager 715 may be an example of aspects of the communications manager 1010 described herein.

The communications manager 715, or its sub-components, may be implemented in hardware, code (e.g., software or firmware) executed by a processor, or any combination thereof. If implemented in code executed by a processor, the functions of the communications manager 715, or its sub-components may be executed by a general-purpose processor, a digital signal processor (DSP), an ASIC, a field-programmable gate array (FPGA) or other programmable logic device, discrete gate or transistor logic, discrete hardware components, or any combination thereof designed to perform the functions described in the present disclosure.

The communications manager 715, or its sub-components, may be physically located at various positions, including being distributed such that portions of functions are implemented at different physical locations by one or more physical components. In some examples, the communications manager 715, or its sub-components, may be a separate and distinct component in accordance with various aspects of the present disclosure. In some examples, the communications manager 715, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 720 may transmit signals generated by other components of the device 705. In some examples, the transmitter 720 may be collocated with a receiver 710 in a transceiver module. For example, the transmitter 720 may be an example of aspects of the transceiver 1020 described with reference to FIG. 10. The transmitter 720 may utilize a single antenna or a set of antennas.

In some examples, the communications manager 715 may be implemented as an integrated circuit or chipset for a mobile device modem, and the receiver 710 and transmitter 720 may be implemented as analog components (e.g., amplifiers, filters, antennas) coupled with the mobile device modem to enable wireless transmission and reception over one or more bands.

The communications manager 715 as described herein may be implemented to realize one or more potential advantages. One implementation may allow the device 705 to more efficiently terminate a decoding operation of a signal before completing the decoding operation based on progressively (e.g., continuously) computing an expected error detection bit as the signal is received (e.g., decoded and deinterleaved). By progressively computing an expected error detection bit, the device 605 may compare the expected error detection bit to an error detection bit received in the signal approximately as soon as the error detection bit is received in the signal.

Based on techniques for more efficiently terminating a decoding operation of a signal, the communications manager 715 may lower latency associated with the decoding operation and may also perform fewer decoding cycles (e.g., when the device performs an early termination of the decoding operation). As such, the one or more processing blocks of the device 705 may enter a sleep mode (e.g., a micro sleep mode in which the one or more processing blocks of the device 705 may operate at a low or zero power consumption level) for a longer duration, which may result in an increase of power savings and a longer battery life. Additionally or alternatively, one or more processing blocks of the device 705 may be re-tasked from the decoding operation to another processing task at the device 705, which may improve processing efficiency at the device 605.

Figure 8:
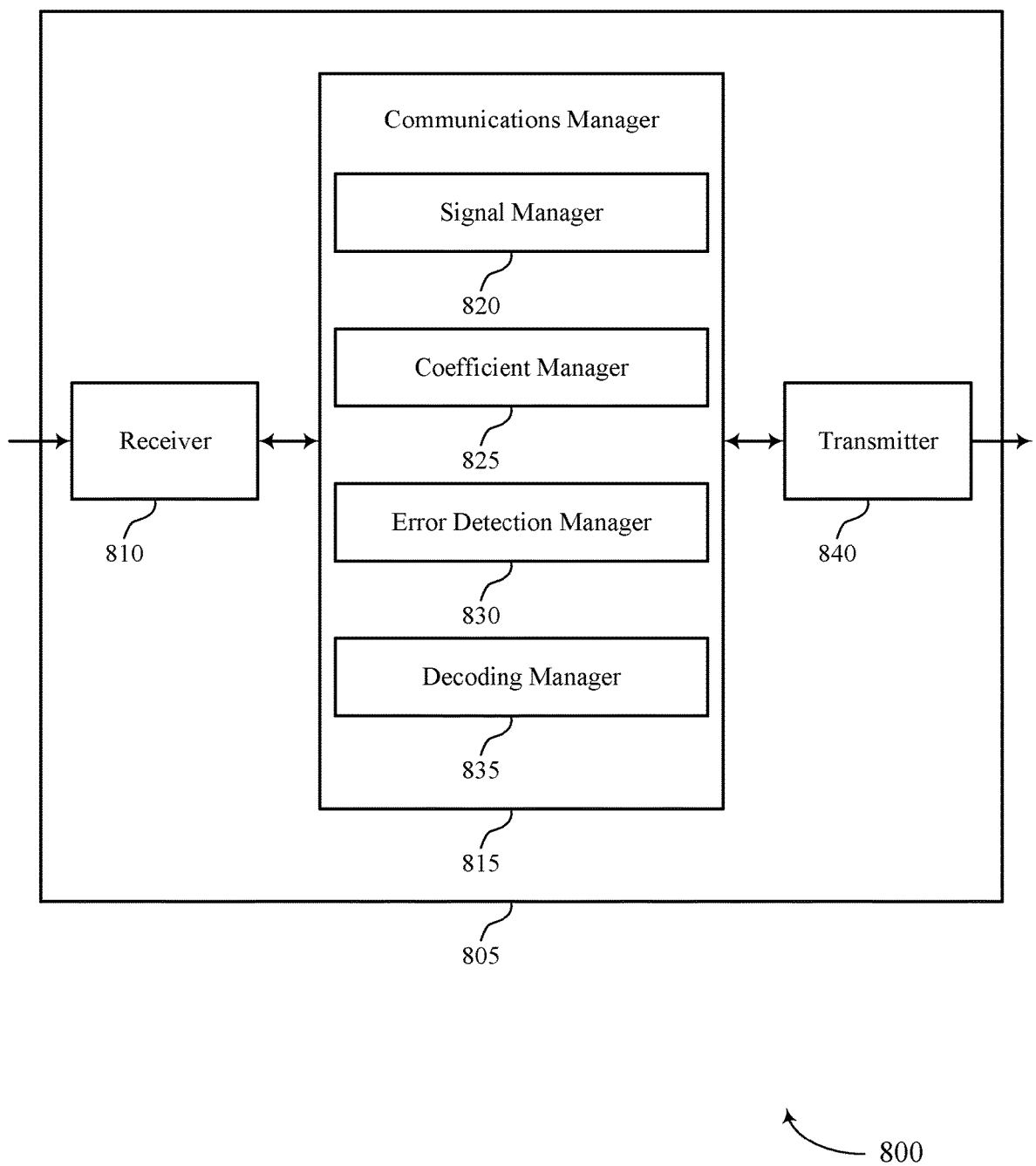

FIG. 8 shows a block diagram 800 of a device 805 that supports error detection for a wireless channel in accordance with aspects of the present disclosure, in particular of any of the previous and following examples. The device 805 may be an example of aspects of a device 705, or a UE 115 as described herein. The device 805 may include a receiver 810, a communications manager 815, and a transmitter 840. The device 805 may also include a processor. Each of these components may be in communication with one another (e.g., via one or more buses).

The receiver 810 may receive information such as packets, user data, or control information associated with various information channels (e.g., control channels, data channels, and information related to error detection method for a wireless channel, etc.). Information may be passed on to other components of the device 805. The receiver 810 may be an example of aspects of the transceiver 1020 described with reference to FIG. 10. The receiver 810 may utilize a single antenna or a set of antennas.

The communications manager 815 may be an example of aspects of the communications manager 715 as described herein. The communications manager 815 may include a signal manager 820, a coefficient manager 825, an error detection manager 830, and a decoding manager 835. The communications manager 815 may be an example of aspects of the communications manager 1010 described herein.

The signal manager 820 may receive a signal that includes a set of error detection bits interleaved with a set of information bits. In some examples, the signal manager 820 may receive a signal that includes a set of error detection values and a set of information values.

The coefficient manager 825 may identify a coefficient associated with a first information bit of the set of information bits and used for calculating at least one error detection bit based on receiving the signal. In some examples, the coefficient manager 825 may determine a coefficient, the coefficient associated with a first information value of the set of information values, configured for determining at least one error detection value.

The error detection manager 830 may calculate the first error detection bit based on the coefficient and the first information bit and determine that a second error detection bit received in the signal and associated with the first information bit is different than the first error detection bit calculated using the coefficient and the first information bit. In some examples, the error detection manager 830 may determine a first error detection value based on the coefficient associated with the first information value and determine that a second error detection value received in the signal and associated with the first information value is different than the first error detection value.

The decoding manager 835 may terminate a decoding operation of the signal that, in some examples, may use a polar code before the decoding operation is complete based on determining that the first error detection bit is different than the second error detection bit. In some examples, the decoding manager 835 may terminate decoding of the signal based on the first error detection value and the second error detection value.

The transmitter 840 may transmit signals generated by other components of the device 805. In some examples, the transmitter 840 may be collocated with a receiver 810 in a transceiver module. For example, the transmitter 840 may be an example of aspects of the transceiver 1020 described with reference to FIG. 10. The transmitter 840 may utilize a single antenna or a set of antennas.

Figure 9:
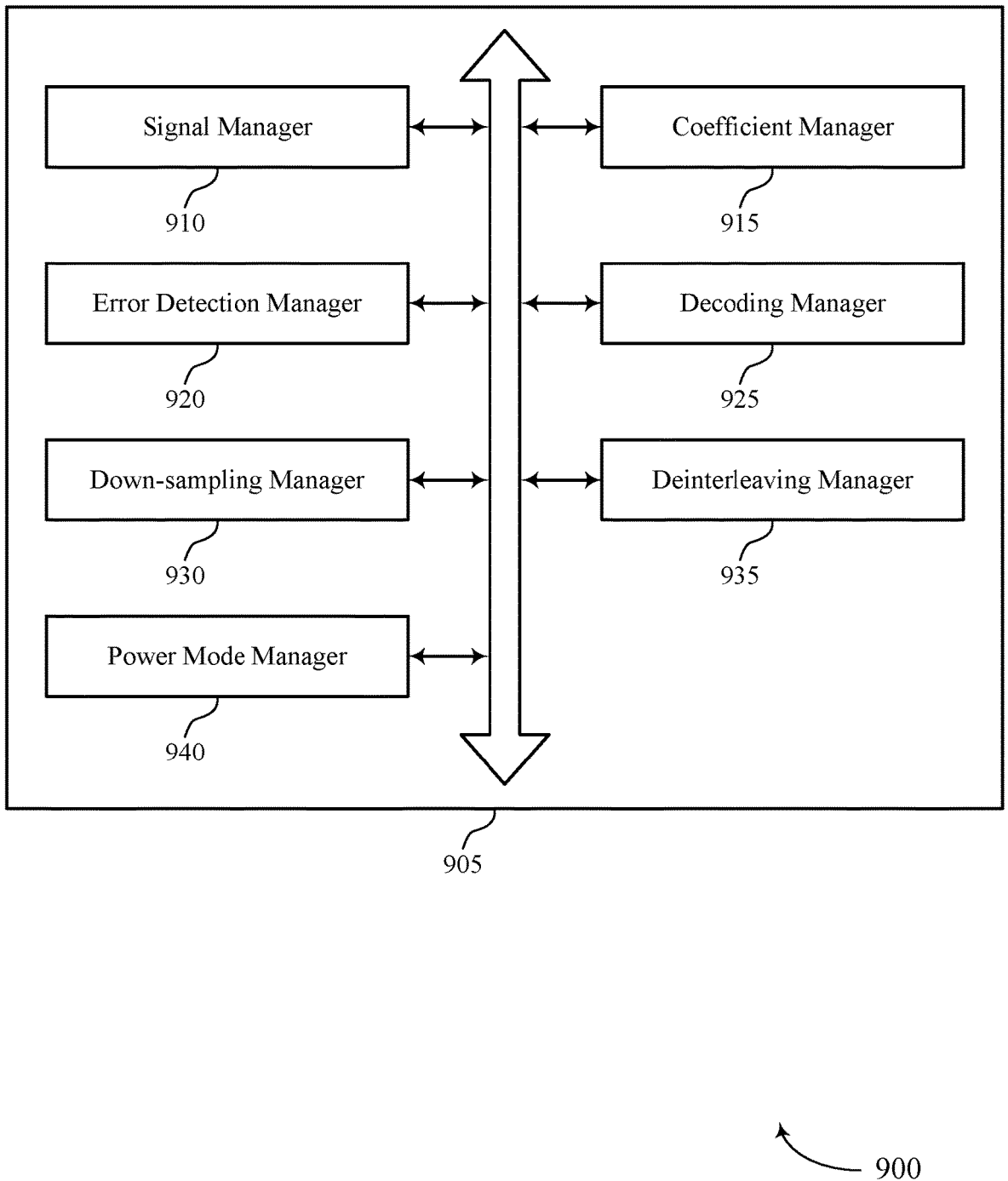
FIG. 9 shows a block diagram of a communications manager that supports error detection for a wireless channel in accordance with aspects of the present disclosure.

FIG. 9 shows a block diagram 900 of a communications manager 905 that supports error detection for a wireless channel in accordance with aspects of the present disclosure, in particular of any of the previous and following examples. The communications manager 905 may be an example of aspects of a communications manager 715, a communications manager 815, or a communications manager 1010 described herein. The communications manager 905 may include a signal manager 910, a coefficient manager 915, an error detection manager 920, a decoding manager 925, a down-sampling manager 930, a deinterleaving manager 935, and a power mode manager 940. Each of these modules may communicate, directly or indirectly, with one another (e.g., via one or more buses).

The signal manager 910 may receive a signal that includes a set of error detection bits interleaved with a set of information bits. In some examples, the signal manager 910 may receive a signal that includes a set of error detection values and a set of information values.

In some examples, the signal manager 910 may identify an index value for the first information bit based on receiving the signal, where identifying the coefficient is based on identifying the index value. In some examples, identifying a set of information bits of the signal associated with the second error detection bit based on receiving the signal, where the set of information bits includes the first information bit. In some cases, the signal includes a downlink control channel.

In some examples, the signal manager 910 may determine an index value associated with the first information value based on receiving the signal, where determining the coefficient is based on determining the index value. In some examples, identifying a set of information values of the signal associated with the second error detection value based on receiving the signal, where the set of information values includes the first information value. In some cases, the set of error detection values is interleaved with the set of information values.

The coefficient manager 915 may identify a coefficient associated with a first information bit of the set of information bits and used for calculating at least one error detection bit based on receiving the signal. In some examples, the coefficient manager 915 may retrieve the coefficient from a memory based on the index value identified for the first information bit. In some examples, the coefficient manager 915 may retrieve a value from a memory based on the second index value, where the coefficient is identified based on the value retrieved from the memory and a third index value.

In some examples, the coefficient manager 915 may accumulate one or more information bits and one or more coefficients, where calculating the first error detection bit is based on accumulating the set of information bits and the one or more coefficients. In some examples, the coefficient manager 915 may identify a set of coefficients, each coefficient of the set of coefficients associated with an information bit of the set of information bits based on identifying the set of information bits, where calculating the first error detection bit is based on the set of coefficients and the set of information bits. In some examples, the coefficient manager 915 may identify the coefficient occurs while the signal is being decoded using a polar code.

The coefficient manager 915 may determine a coefficient, the coefficient associated with a first information value of the set of information values, configured for determining at least one error detection value. In some examples, the coefficient manager 915 may retrieve the coefficient from a memory based on the determined index value. In some examples, the coefficient manager 915 may retrieve a value from a memory based on the second index value, where the coefficient is determined based on the value retrieved from the memory and the third index value.

In some examples, the coefficient manager 915 may accumulate one or more information values and one or more coefficients, where determining the first error detection value is based on accumulating the set of information values and the one or more coefficients. In some examples, the coefficient manager 915 may determine a set of coefficients, each coefficient of the set of coefficients associated with an information value of the set of information values based on identifying the set of information values, where determining the first error detection value is based on the set of coefficients and the set of information values.

The error detection manager 920 may calculate the first error detection bit based on the coefficient and the first information bit. In some examples, the error detection manager 920 may determine that a second error detection bit received in the signal and associated with the first information bit is different than the first error detection bit calculated using the coefficient and the first information bit. In some examples, the error detection manager 920 may apply an identifier mask to the first error detection bit, where determining that the first error detection bit is different than the second error detection bit is based on applying the identifier mask to the first error detection bit.

In some examples, the error detection manager 920 may apply a set of identifier masks to the first error detection bit to generate a set of candidate bits, respectively. In some examples, the error detection manager 920 may compare each bit of the set of candidate bits to the second error detection bit, where determining that the first error detection bit is different than the second error detection bit is based on comparing each bit of the set of candidate bits to the second error detection bit. In some cases, the first error detection bit is calculated using any numerical quantity of information bits and coefficients. In some cases, the first error detection bit includes a CRC bit.

The error detection manager 920 may determine a first error detection value based on the coefficient associated with the first information value. In some examples, the error detection manager 920 may determine that a second error detection value received in the signal and associated with the first information value is different than the first error detection value. In some examples, the error detection manager 920 may apply an identifier mask (e.g., an RNTI) to the first error detection value, where determining that the first error detection value is different than the second error detection value is based on applying the identifier mask to the first error detection value.

In some examples, the error detection manager 920 may apply a set of identifier masks (e.g., a set of RNTIs) to the first error detection value to generate a set of candidate values, respectively. In some examples, the error detection manager 920 may compare each value of the set of candidate values to the second error detection value, where determining that the first error detection value is different than the second error detection value is based on comparing each value of the set of candidate values to the second error detection value.

In some examples, the error detection manager 920 may compare the first error detection value with the second error detection value, where determining that the first error detection value is different than the second error detection value is based on comparing the first error detection value with the second error detection value. In some cases, an error detection value may include an error detection bit and an information value may include an information bit. In some cases, the first error detection value is determined using the coefficient and the first information value.

The decoding manager 925 may terminate decoding of the signal based on the first error detection value and the second error detection value. In some examples, the decoding manager 925 may decode the signal using a polar code to identify the first information value of the set of information values and the second error detection value of the set of error detection values included in the signal based on receiving the signal, where determining the coefficient is based on decoding the signal using the polar code.

The decoding manager 925 may terminate a decoding operation of the signal before the decoding operation is complete based on determining that the first error detection bit is different than the second error detection bit. In some examples, the decoding manager 925 may decode the signal using a polar code to identify the first information bit of the set of information bits and the second error detection bit of the set of error detection bits included in the signal based on receiving the signal, where identifying the coefficient is based on decoding the signal using the polar code.

The down-sampling manager 930 may identify a second index value and a third index value based on the index value of the first information bit. In some examples, the down-sampling manager 930 may apply a division operation using a second value to the index value to generate the second index value, where identifying the second index value is based on applying the division operation. The second value, for example, may be a down-sampling factor. In some examples, the down-sampling manager 930 may apply a modulo operation using the second value to the index value to generate the third index value, where identifying the third index value is based on applying the modulo operation. In some cases, the memory stores a down-sampled set of coefficients associated with the set of information bits.

The down-sampling manager 930 may determine a second index value and a third index value based on the index value associated with the first information value. In some examples, the down-sampling manager 930 may apply a division operation using a second value to the index value to generate the second index value, where determining the second index value is based on applying the division operation. In some examples, the down-sampling manager 930 may apply a modulo operation using the second value to the index value to generate the third index value, where determining the third index value is based on applying the modulo operation. In some cases, the memory stores a down-sampled set of coefficients associated with the set of information values.

The deinterleaving manager 935 may deinterleave the second error detection bit from the set of information bits of the signal. In some examples, the deinterleaving manager 935 may deinterleave the second error detection bit from the set of information bits of the signal based on decoding the signal using the polar code, where identifying the coefficient is based on deinterleaving the second error detection bit from the set of information bits. The deinterleaving manager 935 may deinterleave the second error detection value from the set of information values of the signal based on decoding the signal using the polar code.

The power mode manager 940 may be a component of a UE, such as a UE 115, and may enter a lower power mode of the UE based on terminating the decoding operation. In some cases, the lower power mode is a micro-sleep mode of the UE.

Figure 10:
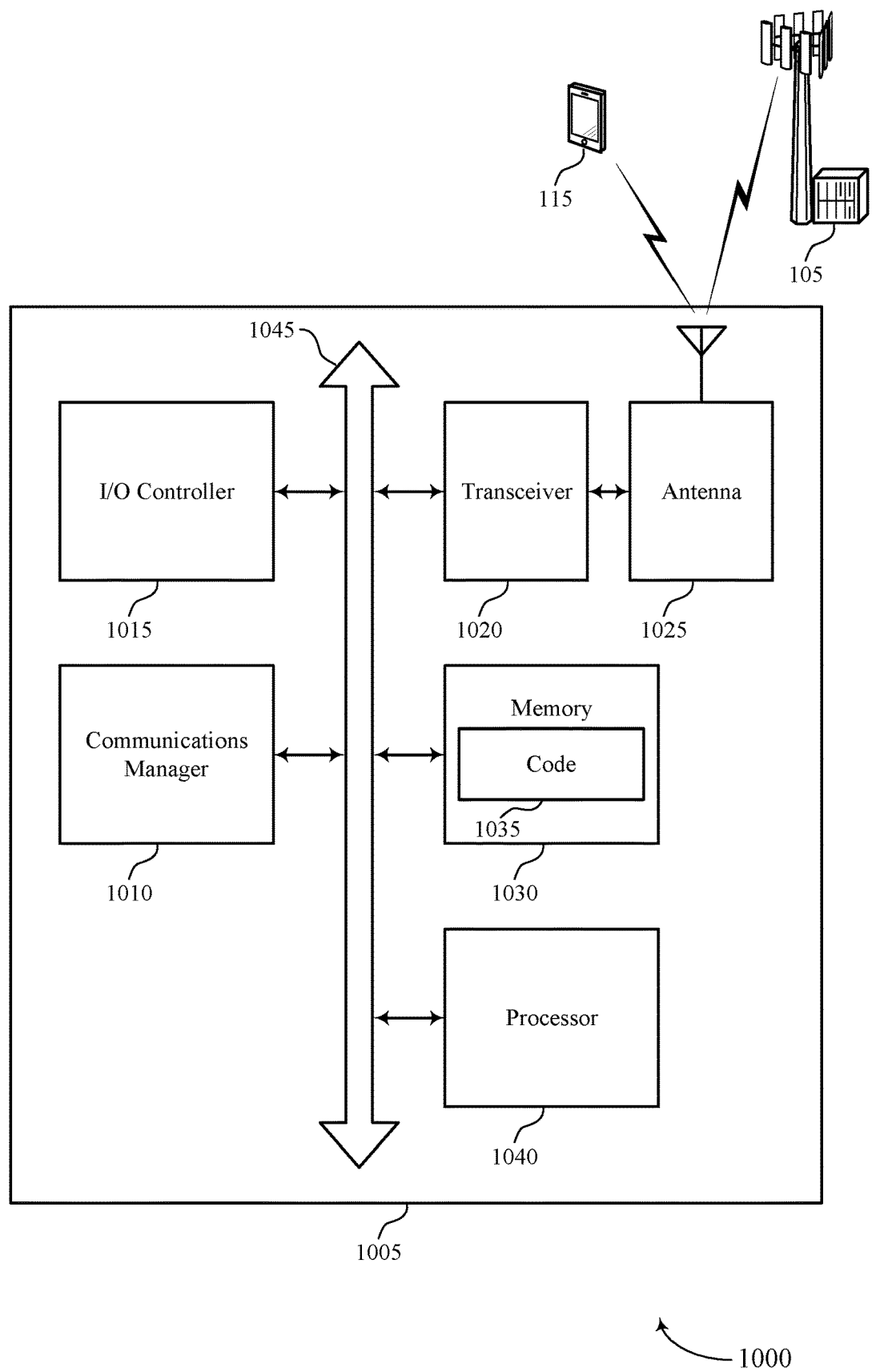
FIG. 10 shows a diagram of a system including a device that supports error detection for a wireless channel in accordance with aspects of the present disclosure.

FIG. 10 shows a diagram of a system 1000 including a device 1005 that supports error detection for a wireless channel in accordance with aspects of the present disclosure, in particular of any of the previous and following examples. The device 1005 may be an example of or include the components of device 705, device 805, or a UE 115 as described herein. The device 1005 may include components for bi-directional voice and data communications including components for transmitting and receiving communications, including a communications manager 1010, an I/O controller 1015, a transceiver 1020, an antenna 1025, memory 1030, and a processor 1040. These components may be in electronic communication via one or more buses (e.g., bus 1045).

The communications manager 1010 may receive a signal that includes a set of error detection bits interleaved with a set of information bits, identify a coefficient associated with a first information bit of the set of information bits and used for calculating at least one error detection bit based on receiving the signal, calculate the first error detection bit based on the coefficient and the first information bit, determine that a second error detection bit received in the signal and associated with the first information bit is different than the first error detection bit calculated using the coefficient and the first information bit, and terminate a decoding operation of the signal before the decoding operation is complete based on determining that the first error detection bit is different than the second error detection bit.

The communications manager 1010 may also receive a signal that includes a set of error detection values and a set of information values, determine a coefficient, the coefficient associated with a first information value of the set of information values, configured for determining at least one error detection value, determine a first error detection value based on the coefficient associated with the first information value, determine that a second error detection value received in the signal and associated with the first information value is different than the first error detection value, and terminate decoding of the signal based on the first error detection value and the second error detection value.

The I/O controller 1015 may manage input and output signals for the device 1005. The I/O controller 1015 may also manage peripherals not integrated into the device 1005. In some cases, the I/O controller 1015 may represent a physical connection or port to an external peripheral. In some cases, the I/O controller 1015 may utilize an operating system such as iOS®, ANDROID®, MS-DOS®, MS-WINDOWS®, OS/2, UNIX®, LINUX®, or another known operating system. In other cases, the I/O controller 1015 may represent or interact with a modem, a keyboard, a mouse, a touchscreen, or a similar device. In some cases, the I/O controller 1015 may be implemented as part of a processor. In some cases, a user may interact with the device 1005 via the I/O controller 1015 or via hardware components controlled by the I/O controller 1015.

The transceiver 1020 may communicate bi-directionally, via one or more antennas, wired, or wireless links as described above. For example, the transceiver 1020 may represent a wireless transceiver and may communicate bi-directionally with another wireless transceiver. The transceiver 1020 may also include a modem to modulate the packets and provide the modulated packets to the antennas for transmission, and to demodulate packets received from the antennas.

In some cases, the wireless device may include a single antenna 1025. However, in some cases the device may have more than one antenna 1025, which may be capable of concurrently transmitting or receiving multiple wireless transmissions.

The memory 1030 may include random-access memory (RAM) and read-only memory (ROM). The memory 1030 may store computer-readable, computer-executable code 1035 including instructions that, when executed, cause the processor to perform various functions described herein. In some cases, the memory 1030 may contain, among other things, a basic I/O system (BIOS) which may control basic hardware or software operation such as the interaction with peripheral components or devices.

The processor 1040 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 1040 may be configured to operate a memory array using a memory controller. In other cases, a memory controller may be integrated into the processor 1040. The processor 1040 may be configured to execute computer-readable instructions stored in a memory (e.g., the memory 1030) to cause the device 1005 to perform various functions (e.g., functions or tasks supporting error detection method for a wireless channel).

The code 1035 may include instructions to implement aspects of the present disclosure, including instructions to support wireless communications. The code 1035 may be stored in a non-transitory computer-readable medium such as system memory or other type of memory. In some cases, the code 1035 may not be directly executable by the processor 1040 but may cause a computer (e.g., when compiled and executed) to perform functions described herein.

Figure 11:
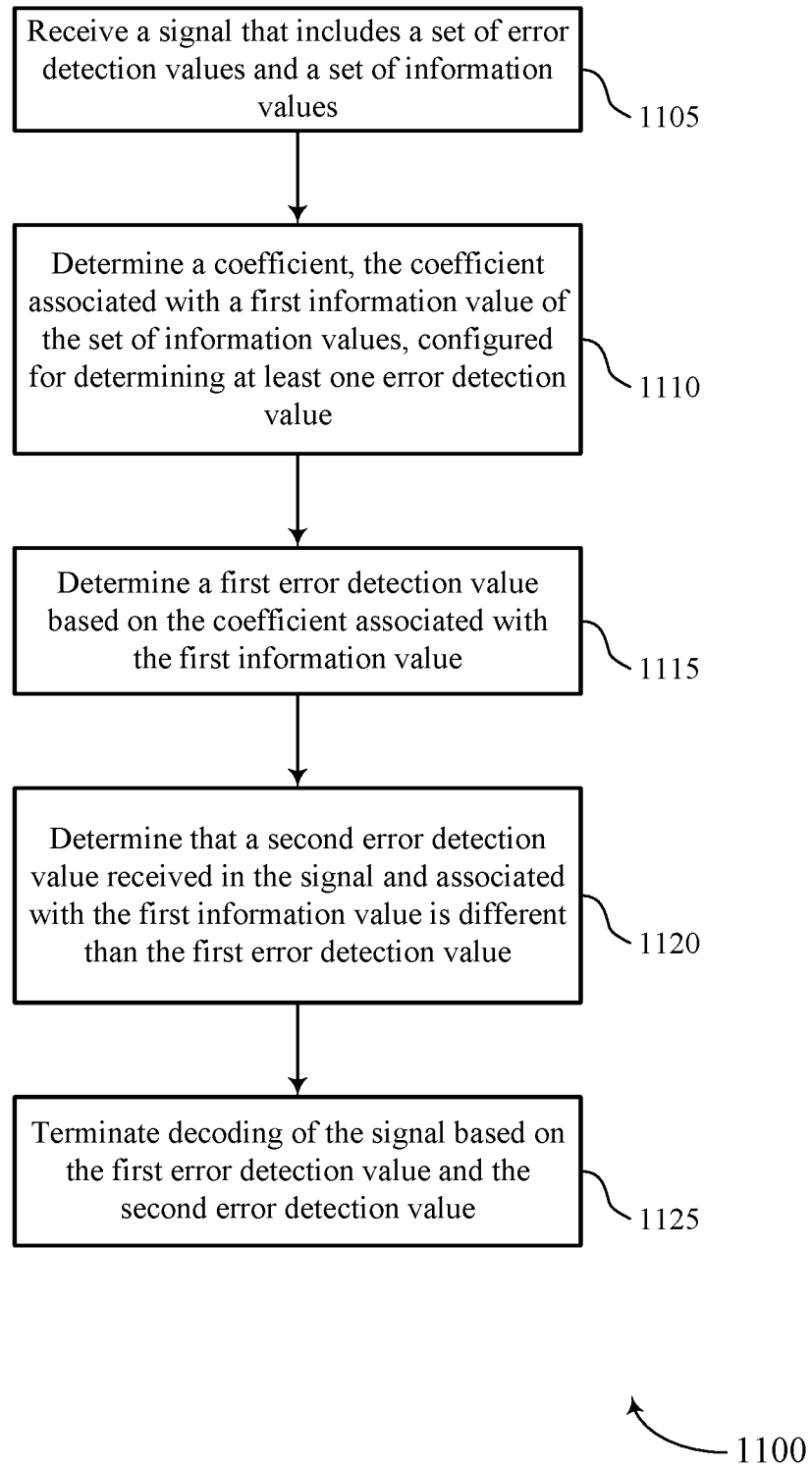
FIGS. 11 through 14 show flowcharts illustrating methods that support error detection for a wireless channel in accordance with aspects of the present disclosure.

FIG. 11 shows a flowchart illustrating a method 1100 that supports error detection for a wireless channel in accordance with aspects of the present disclosure, in particular of any of the previous and following examples. The operations of method 1100 may be implemented by a UE 115 or its components as described herein. For example, the operations of method 1100 may be performed by a communications manager as described with reference to FIGS. 7 through 10. In some examples, a UE may execute a set of instructions to control the functional elements of the UE to perform the functions described below. Additionally or alternatively, a UE may perform aspects of the functions described below using special-purpose hardware.

At 1105, the UE may receive a signal that includes a set of error detection values and a set of information values. The operations of 1105 may be performed according to the methods described herein. In some examples, aspects of the operations of 1105 may be performed by a signal manager as described with reference to FIGS. 7 through 10.

At 1110, the UE may determine a coefficient, the coefficient associated with a first information value of the set of information values, configured for determining at least one error detection value. The operations of 1110 may be performed according to the methods described herein. In some examples, aspects of the operations of 1110 may be performed by a coefficient manager as described with reference to FIGS. 7 through 10.

At 1115, the UE may determine a first error detection value based on the coefficient associated with the first information value. The operations of 1115 may be performed according to the methods described herein. In some examples, aspects of the operations of 1115 may be performed by an error detection manager as described with reference to FIGS. 7 through 10.

At 1120, the UE may determine that a second error detection value received in the signal and associated with the first information value is different than the first error detection value. The operations of 1120 may be performed according to the methods described herein. In some examples, aspects of the operations of 1120 may be performed by an error detection manager as described with reference to FIGS. 7 through 10.

At 1125, the UE may terminate decoding of the signal based on the first error detection value and the second error detection value. The operations of 1125 may be performed according to the methods described herein. In some examples, aspects of the operations of 1125 may be performed by a decoding manager as described with reference to FIGS. 7 through 10.

Figure 12:
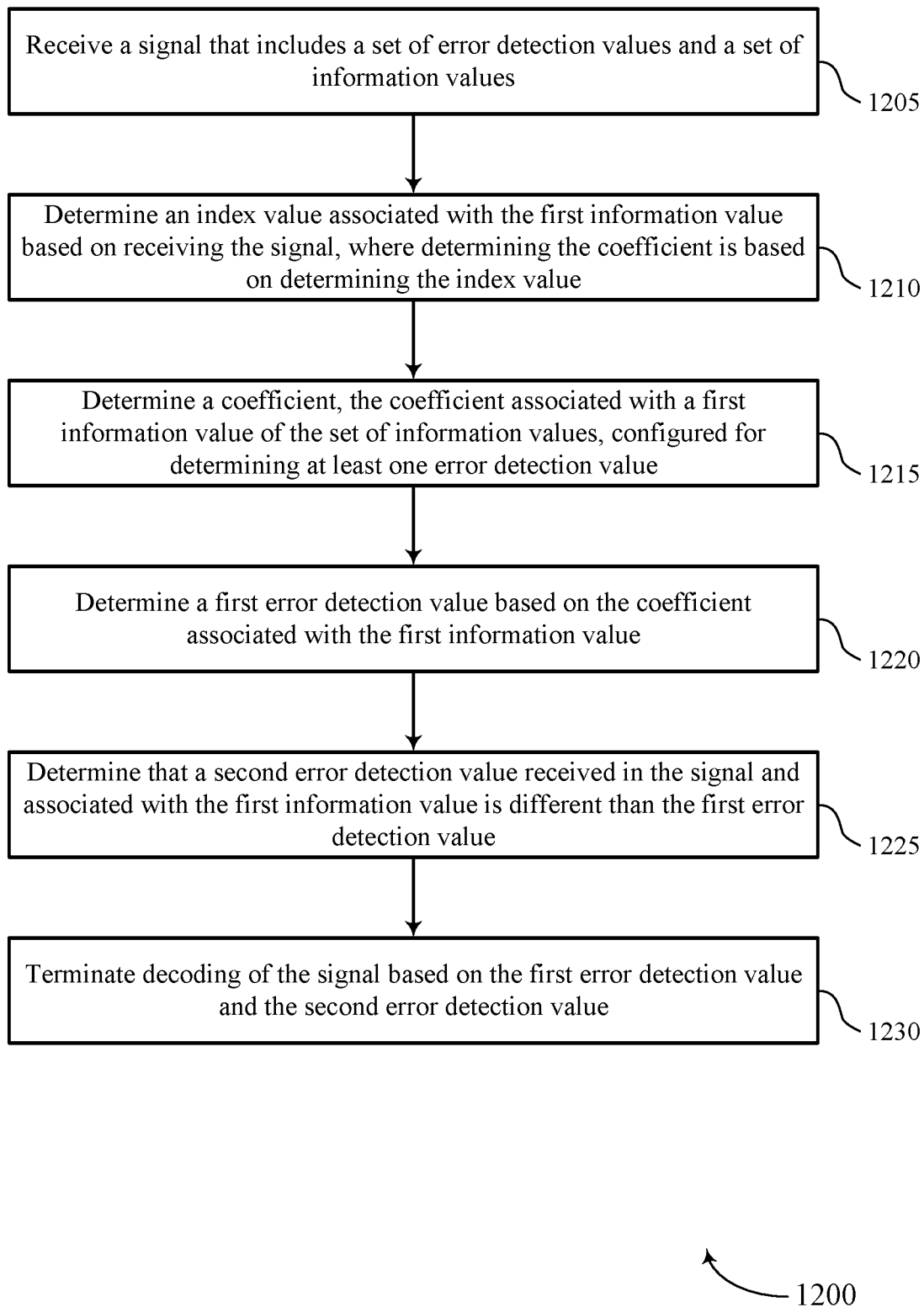

FIG. 12 shows a flowchart illustrating a method 1200 that supports error detection for a wireless channel in accordance with aspects of the present disclosure, in particular of any of the previous and following examples. The operations of method 1200 may be implemented by a UE 115 or its components as described herein. For example, the operations of method 1200 may be performed by a communications manager as described with reference to FIGS. 7 through 10. In some examples, a UE may execute a set of instructions to control the functional elements of the UE to perform the functions described below. Additionally or alternatively, a UE may perform aspects of the functions described below using special-purpose hardware.

At 1205, the UE may receive a signal that includes a set of error detection values and a set of information values. The operations of 1205 may be performed according to the methods described herein. In some examples, aspects of the operations of 1205 may be performed by a signal manager as described with reference to FIGS. 7 through 10.

At 1210, the UE may determine an index value associated with the first information value based on receiving the signal, where determining the coefficient is based on determining the index value. The operations of 1210 may be performed according to the methods described herein. In some examples, aspects of the operations of 1210 may be performed by a signal manager as described with reference to FIGS. 7 through 10.

At 1215, the UE may determine a coefficient, the coefficient associated with a first information value of the set of information values, configured for determining at least one error detection value. The operations of 1215 may be performed according to the methods described herein. In some examples, aspects of the operations of 1215 may be performed by a coefficient manager as described with reference to FIGS. 7 through 10.

At 1220, the UE may determine a first error detection value based on the coefficient associated with the first information value. The operations of 1220 may be performed according to the methods described herein. In some examples, aspects of the operations of 1220 may be performed by an error detection manager as described with reference to FIGS. 7 through 10.

At 1225, the UE may determine that a second error detection value received in the signal and associated with the first information value is different than the first error detection value. The operations of 1225 may be performed according to the methods described herein. In some examples, aspects of the operations of 1225 may be performed by an error detection manager as described with reference to FIGS. 7 through 10.

At 1230, the UE may terminate decoding of the signal based on the first error detection value and the second error detection value. The operations of 1230 may be performed according to the methods described herein. In some examples, aspects of the operations of 1230 may be performed by a decoding manager as described with reference to FIGS. 7 through 10.

Figure 13:
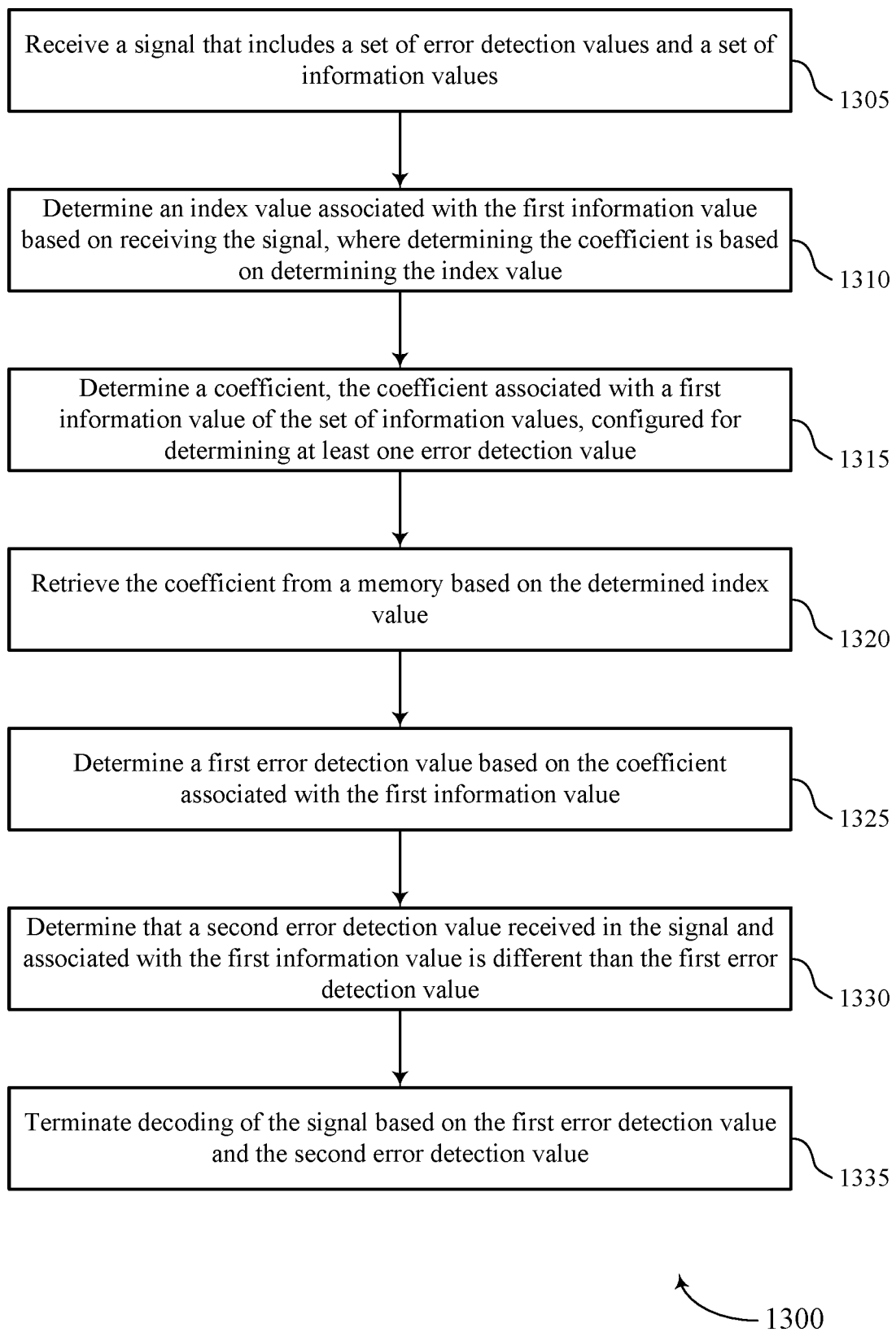

FIG. 13 shows a flowchart illustrating a method 1300 that supports error detection for a wireless channel in accordance with aspects of the present disclosure, in particular of any of the previous and following examples. The operations of method 1300 may be implemented by a UE 115 or its components as described herein. For example, the operations of method 1300 may be performed by a communications manager as described with reference to FIGS. 7 through 10. In some examples, a UE may execute a set of instructions to control the functional elements of the UE to perform the functions described below. Additionally or alternatively, a UE may perform aspects of the functions described below using special-purpose hardware.

At 1305, the UE may receive a signal that includes a set of error detection values and a set of information values. The operations of 1305 may be performed according to the methods described herein. In some examples, aspects of the operations of 1305 may be performed by a signal manager as described with reference to FIGS. 7 through 10.

At 1310, the UE may determine an index value associated with the first information value based on receiving the signal, where determining the coefficient is based on determining the index value. The operations of 1310 may be performed according to the methods described herein. In some examples, aspects of the operations of 1310 may be performed by a signal manager as described with reference to FIGS. 7 through 10.

At 1315, the UE may determine a coefficient, the coefficient associated with a first information value of the set of information values, configured for determining at least one error detection value. The operations of 1315 may be performed according to the methods described herein. In some examples, aspects of the operations of 1315 may be performed by a coefficient manager as described with reference to FIGS. 7 through 10.

At 1320, the UE may retrieve the coefficient from a memory based on the determined index value. The operations of 1320 may be performed according to the methods described herein. In some examples, aspects of the operations of 1320 may be performed by a coefficient manager as described with reference to FIGS. 7 through 10.

At 1325, the UE may determine a first error detection value based on the coefficient associated with the first information value. The operations of 1325 may be performed according to the methods described herein. In some examples, aspects of the operations of 1325 may be performed by an error detection manager as described with reference to FIGS. 7 through 10.

At 1330, the UE may determine that a second error detection value received in the signal and associated with the first information value is different than the first error detection value. The operations of 1330 may be performed according to the methods described herein. In some examples, aspects of the operations of 1330 may be performed by an error detection manager as described with reference to FIGS. 7 through 10.

At 1335, the UE may terminate decoding of the signal based on the first error detection value and the second error detection value. The operations of 1335 may be performed according to the methods described herein. In some examples, aspects of the operations of 1335 may be performed by a decoding manager as described with reference to FIGS. 7 through 10.

Figure 14:
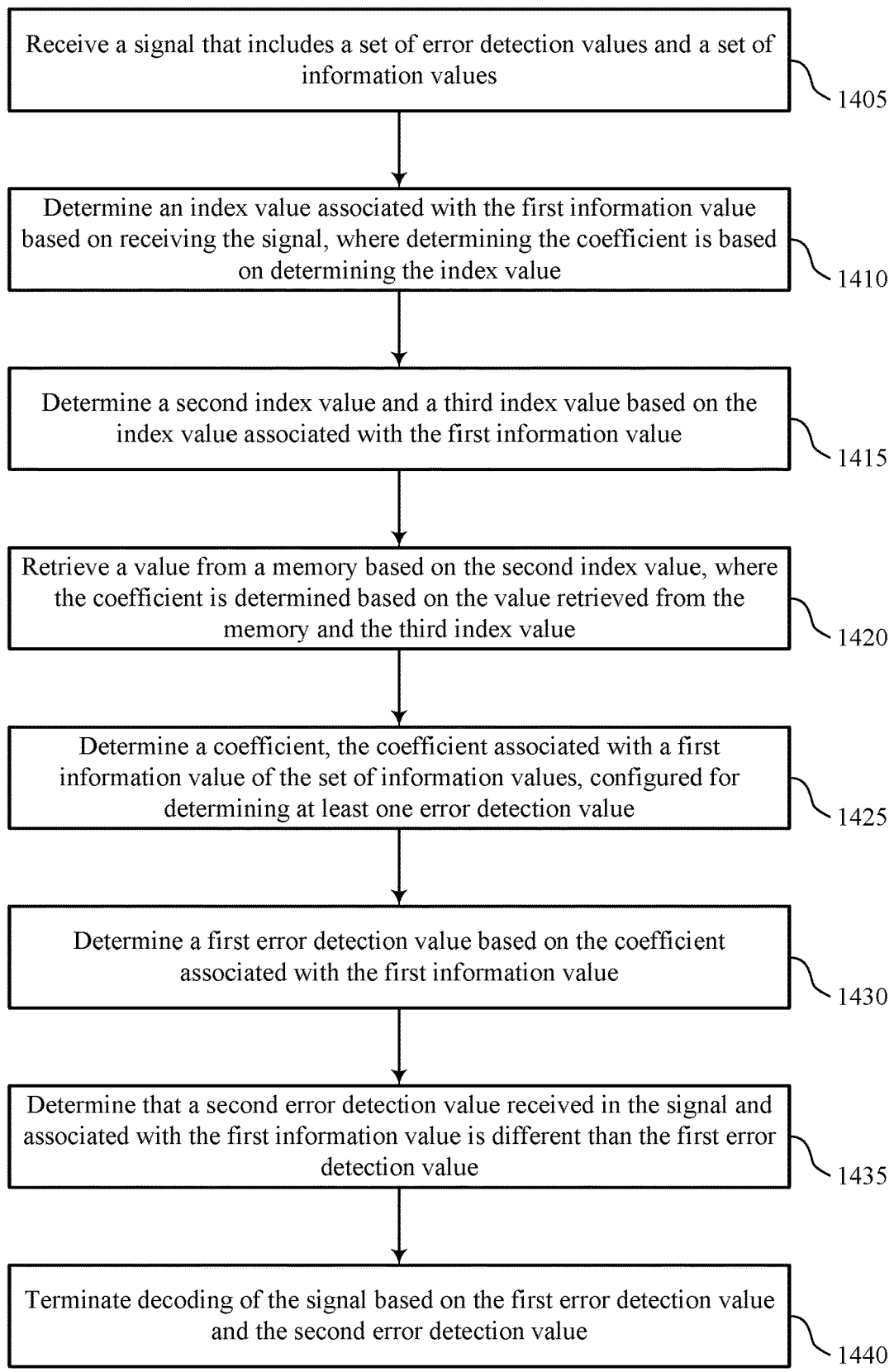

FIG. 14 shows a flowchart illustrating a method 1400 that supports error detection for a wireless channel in accordance with aspects of the present disclosure, in particular of any of the previous and following examples. The operations of method 1400 may be implemented by a UE 115 or its components as described herein. For example, the operations of method 1400 may be performed by a communications manager as described with reference to FIGS. 7 through 10. In some examples, a UE may execute a set of instructions to control the functional elements of the UE to perform the functions described below. Additionally or alternatively, a UE may perform aspects of the functions described below using special-purpose hardware.

At 1405, the UE may receive a signal that includes a set of error detection values and a set of information values. The operations of 1405 may be performed according to the methods described herein. In some examples, aspects of the operations of 1405 may be performed by a signal manager as described with reference to FIGS. 7 through 10.

At 1410, the UE may determine an index value associated with the first information value based on receiving the signal, where determining the coefficient is based on determining the index value. The operations of 1410 may be performed according to the methods described herein. In some examples, aspects of the operations of 1410 may be performed by a signal manager as described with reference to FIGS. 7 through 10.

At 1415, the UE may determine a second index value and a third index value based on the index value associated with the first information value. The operations of 1415 may be performed according to the methods described herein. In some examples, aspects of the operations of 1415 may be performed by a down-sampling manager as described with reference to FIGS. 7 through 10.

At 1420, the UE may retrieve a value from a memory based on the second index value, where the coefficient is determined based on the value retrieved from the memory and the third index value. The operations of 1420 may be performed according to the methods described herein. In some examples, aspects of the operations of 1420 may be performed by a coefficient manager as described with reference to FIGS. 7 through 10.

At 1425, the UE may determine a coefficient, the coefficient associated with a first information value of the set of information values, configured for determining at least one error detection value. The operations of 1425 may be performed according to the methods described herein. In some examples, aspects of the operations of 1425 may be performed by a coefficient manager as described with reference to FIGS. 7 through 10.

At 1430, the UE may determine a first error detection value based on the coefficient associated with the first information value. The operations of 1430 may be performed according to the methods described herein. In some examples, aspects of the operations of 1430 may be performed by an error detection manager as described with reference to FIGS. 7 through 10.

At 1435, the UE may determine that a second error detection value received in the signal and associated with the first information value is different than the first error detection value. The operations of 1435 may be performed according to the methods described herein. In some examples, aspects of the operations of 1435 may be performed by an error detection manager as described with reference to FIGS. 7 through 10.

At 1440, the UE may terminate decoding of the signal based on the first error detection value and the second error detection value. The operations of 1440 may be performed according to the methods described herein. In some examples, aspects of the operations of 1440 may be performed by a decoding manager as described with reference to FIGS. 7 through 10.

It should be noted that the methods described herein describe possible implementations, and that the operations and the procedures may be rearranged or otherwise modified and that other implementations are possible. Further, aspects from two or more of the methods may be combined.

In the following, several further examples of the invention are provided to facilitate understanding of the aspects of the present disclosure:

Example 1: A method for wireless communication, comprising receiving a signal that comprises a plurality of error detection values and a plurality of information values, determining a coefficient, the coefficient associated with a first information value of the plurality of information values, configured for determining at least one error detection value, determining a first error detection value based at least in part on the coefficient associated with the first information value, determining a first error detection value based at least in part on the coefficient associated with the first information value, determining that a second error detection value received in the signal and associated with the first information value is different than the first error detection value, and terminating decoding of the signal based at least in part on the first error detection value and the second error detection value.

Example 2: The method of example 1, further comprising determining an index value associated with the first information value based at least in part on receiving the signal, wherein determining the coefficient is based at least in part on determining the index value.

Example 3: The method of example 2, wherein determining the coefficient further comprises retrieving the coefficient from a memory based at least in part on the determined index value.

Example 4: The method of example 2, wherein determining the coefficient further comprises determining a second index value and a third index value based at least in part on the index value associated with the first information value and retrieving a value from a memory based at least in part on the second index value, wherein the coefficient is determined based at least in part on the value retrieved from the memory and the third index value.

Example 5: The method of example 4, further comprising applying a division operation using a second value to the index value to generate the second index value, wherein determining the second index value is based at least in part on applying the division operation, and applying a modulo operation using the second value to the index value to generate the third index value, wherein determining the third index value is based at least in part on applying the modulo operation.

Example 6: The method of any of examples 4 or 5, wherein the memory stores a down-sampled set of coefficients associated with the plurality of information values.

Example 7: The method of any of the preceding examples, further comprising decoding the signal using a polar code to identify the first information value of the plurality of information values and the second error detection value of the plurality of error detection values included in the signal based at least in part on receiving the signal, wherein determining the coefficient is based at least in part on decoding the signal using the polar code.

Example 8: The method of example 7, further comprising deinterleaving the second error detection value from the plurality of information values of the signal based at least in part on decoding the signal using the polar code.

Example 9: The method of any of any of the preceding examples, wherein the method is performed at a user equipment, the method further comprising: entering a lower power mode of the UE based at least in part on terminating the decoding.

Example 10: The method of example 9, wherein the lower power mode is a micro-sleep mode of the UE.

Example 11: The method of any of examples 1 to 10, further comprising applying an identifier mask to the first error detection value, wherein determining that the first error detection value is different than the second error detection value is based at least in part on applying the identifier mask to the first error detection value.

Example 12: The method of any of the preceding examples, further comprising applying a plurality of identifier masks to the first error detection value to generate a plurality of candidate values, respectively, and comparing each value of the plurality of candidate values to the second error detection value, wherein determining that the first error detection value is different than the second error detection value is based at least in part on comparing each value of the plurality of candidate values to the second error detection value.

Example 13: The method of any of any of the preceding examples, further comprising accumulating one or more information values and one or more coefficients, wherein determining the first error detection value is based at least in part on accumulating the plurality of information values and the one or more coefficients.

Example 14: the method of any of the preceding examples, further comprising identifying a set of information values of the signal associated with the second error detection value based at least in part on receiving the signal, wherein the set of information values comprises the first information value and determining a set of coefficients, each coefficient of the set of coefficients associated with an information value of the set of information values based at least in part on identifying the set of information values, wherein determining the first error detection value is based at least in part on the set of coefficients and the set of information values.

Example 15: The method of any of the preceding examples, wherein an error detection value comprises an error detection bit and an information value comprises an information bit.

Example 16: The method of any of the preceding examples, where identifying the coefficient occurs while the signal is being decoded using a polar code.

Example 17: The method of any of the preceding examples, wherein the first error detection bit comprises a CRC bit.

Example 18: The method of any of the preceding examples, wherein the signal comprises a downlink control channel.

Example 19: The method of any of the preceding examples, further comprising: comparing the first error detection value with the second error detection value, wherein determining that the first error detection value is different than the second error detection value is based at least in part on comparing the first error detection value with the second error detection value.

Example 20: The method of any of the preceding examples, wherein the first error detection value is determined using the coefficient and the first information value.

Example 21: The method of any of the preceding examples, wherein the plurality of error detection values is interleaved with the plurality of information values.

Example 19: An apparatus for wireless communications comprising a processor, memory coupled with the processor, and instructions stored in the memory and executable by the processor to cause the apparatus to perform a method of any of examples 1 to 21.

Example 21: An apparatus comprising at least one means for performing a method of any of examples 1 to 21.

Example 22: A non-transitory computer-readable medium storing code for wireless communications, the code comprising instructions executable by a processor to perform a method of any of examples 1 to 21.

Example 23: A computer program comprising computer-executable instructions that, when executed on a computer, cause the computer to perform the method of any of examples 1 to 21.

Although aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR networks. For example, the described techniques may be applicable to various other wireless communications systems such as Ultra Mobile Broadband (UMB), Institute of Electrical and Electronics Engineers (IEEE) 802.11 (Wi-Fi), IEEE 802.16 (WiMAX), IEEE 802.20, Flash-OFDM, as well as other systems and radio technologies not explicitly mentioned herein.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof.

The various illustrative blocks and components described in connection with the disclosure herein may be implemented or performed with a general-purpose processor, a DSP, an ASIC, a CPU, an FPGA or other programmable logic device, discrete gate or transistor logic, discrete hardware components, any suitable means adapted to perform the respective functions, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, any suitable means adapted to perform the respective functions, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein may be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that may be accessed by a general-purpose or special purpose computer. By way of example, and not limitation, non-transitory computer-readable media may include RAM, ROM, electrically erasable programmable ROM (EEPROM), flash memory, compact disk (CD) ROM or other optical disk storage, magnetic disk storage or other magnetic storage devices, or any other non-transitory medium that may be used to carry or store desired program code means in the form of instructions or data structures and that may be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of computer-readable medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an example procedure that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "example" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, known structures and devices are shown in block diagram form in order to avoid obscuring the concepts of the described examples.

The description herein is provided to enable a person having ordinary skill in the art to make or use the disclosure. Various modifications to the disclosure will be apparent to a person having ordinary skill in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
    receiving, at a decoder, a signal that comprises a plurality of error detection values and a plurality of information values;
    decoding, using a polar code, one or more information values of the plurality of information values received in the signal;

determining one or more coefficients associated with an expected error detection value as part of an error check for the one or more information values, wherein each coefficient of the one or more coefficients is associated with an information value of the one or more information values;

determining a first error detection value based at least in part on the one or more coefficients associated with the one or more information values, wherein the first error detection value comprises the expected error detection value;

decoding, using the polar code, a second error detection value of the plurality of error detection values received in the signal, the second error detection value associated with the error check for the one or more information values received in the signal;

determining that the second error detection value received in the signal and associated with the error check for the one or more information values is different than the first error detection value; and terminating a decoding of remaining portions of the signal at the decoder that uses the polar code based at least in part on the first error detection value and the second error detection value.

2. The method of claim 1, further comprising:
determining one or more index values associated with the one or more information values based at least in part on receiving the signal, each index value of the one or more index values associated with a different information value of the one or more information values, wherein determining the one or more coefficients is based at least in part on determining the one or more index values.

3. The method of claim 2, wherein determining the one or more coefficients further comprises:
retrieving the one or more coefficients from a memory based at least in part on the determined one or more index values.

4. The method of claim 2, wherein determining the one or more coefficients further comprises:
determining, for a first information value of the one or more information values, a second index value and a third index value based at least in part on a first index value associated with the first information value; and
retrieving a value from a memory based at least in part on the second index value, wherein a coefficient for the first information value is determined based at least in part on the value retrieved from the memory and the third index value.

5. The method of claim 4, further comprising:
applying a division operation using a second value to the first index value to generate the second index value, wherein determining the second index value is based at least in part on applying the division operation; and
applying a modulo operation using the second value to the first index value to generate the third index value, wherein determining the third index value is based at least in part on applying the modulo operation.

6. The method of claim 4, wherein the memory stores a down-sampled set of coefficients associated with the plurality of information values.

7. The method of claim 1, further comprising:
deinterleaving the second error detection value from the plurality of information values of the signal based at least in part on decoding the signal using the polar code.

8. The method of claim 1, wherein the method is performed at a user equipment, the method further comprising:
entering a lower power mode of the user equipment based at least in part on terminating the decoding of the remaining portions of the signal.

9. The method of claim 8, wherein the lower power mode is a micro-sleep mode of the user equipment.

10. The method of claim 1, further comprising:
applying an identifier mask to the first error detection value, wherein determining that the first error detection value is different than the second error detection value is based at least in part on applying the identifier mask to the first error detection value.

11. The method of claim 1, further comprising:
applying a plurality of identifier masks to the first error detection value to generate a plurality of candidate values, respectively; and
comparing each value of the plurality of candidate values to the second error detection value, wherein determining that the first error detection value is different than the second error detection value is based at least in part on comparing each value of the plurality of candidate values to the second error detection value.

12. The method of claim 1, further comprising:
accumulating the one or more information values and the one or more coefficients, wherein determining the first error detection value is based at least in part on accumulating the plurality of information values and the one or more coefficients.

13. The method of claim 1, further comprising:
identifying a set of information values of the signal associated with the second error detection value based at least in part on receiving the signal, wherein the set of information values comprises the one or more information values; and
determining a set of coefficients, each coefficient of the set of coefficients associated with a second information value of the set of information values based at least in part on identifying the set of information values, wherein determining the first error detection value is based at least in part on the set of coefficients and the set of information values.

14. The method of claim 1, further comprising:
comparing the first error detection value with the second error detection value, wherein determining that the first error detection value is different than the second error detection value is based at least in part on comparing the first error detection value with the second error detection value.

15. The method of claim 1, wherein an error detection value comprises an error detection bit and the information value comprises an information bit.

16. The method of claim 1, wherein the first error detection value is determined using the one or more coefficients and the one or more information values.

17. The method of claim 1, wherein the plurality of error detection values is interleaved with the plurality of information values.

18. An apparatus for wireless communication, comprising:
a processor,
memory coupled with the processor; and
instructions stored in the memory and executable by the processor to cause the apparatus to:
receive, at a decoder, a signal that comprises a plurality of error detection values and a plurality of information values;

decode, using a polar code, one or more information values of the plurality of information values received in the signal;

determine one or more coefficients associated with an expected error detection value as part of an error check for the one or more information values, wherein each coefficient of the one or more coefficients is associated with an information value of the one or more information values;

determine a first error detection value based at least in part on the one or more coefficients associated with the one or more information values, wherein the first error detection value comprises the expected error detection value;

decode, using the polar code, a second error detection value of the plurality of error detection values received in the signal, the second error detection value associated with the error check for the one or more information values received in the signal;

determine that the second error detection value received in the signal and associated with the error check for the one or more information values is different than the first error detection value; and terminate a decoding of remaining portions of the signal at the decoder that uses the polar code based at least in part on the first error detection value and the second error detection value.

19. The apparatus of claim 18, wherein the instructions are further executable by the processor to cause the apparatus to:

determine one or more index values associated with the one or more information values based at least in part on receiving the signal, each index value of the one or more index values associated with a different information value of the one or more information values, wherein determining the one or more coefficients is based at least in part on determining the one or more index values.

20. The apparatus of claim 19, wherein the instructions to determine the one or more coefficients are further executable by the processor to cause the apparatus to:

retrieve the one or more coefficients from the memory based at least in part on the determined one or more index values.

21. The apparatus of claim 19, wherein the instructions to determine the one or more coefficients are further executable by the processor to cause the apparatus to:

determine, for a first information value of the one or more information values, a second index value and a third index value based at least in part on a first index value associated with the first information value; and retrieve a value from the memory based at least in part on the second index value, wherein a coefficient for the first information value is determined based at least in part on the value retrieved from the memory and the third index value.

22. The apparatus of claim 21, wherein the instructions are further executable by the processor to cause the apparatus to:

apply a division operation using a second value to the first index value to generate the second index value, wherein determining the second index value is based at least in part on applying the division operation; and apply a modulo operation using the second value to the first index value to generate the third index value, wherein determining the third index value is based at least in part on applying the modulo operation.

23. The apparatus of claim 21, wherein the memory stores a down-sampled set of coefficients associated with the plurality of information values.

24. The apparatus of claim 18, wherein the instructions are further executable by the processor to cause the apparatus to:

deinterleave the second error detection value from the plurality of information values of the signal based at least in part on decoding the signal using the polar code.

25. The apparatus of claim 18, wherein the instructions are further executable by the processor to cause the apparatus to:

enter a lower power mode based at least in part on terminating the decoding of the remaining portions of the signal.

26. The apparatus of claim 25, wherein the lower power mode is a micro-sleep mode of a user equipment.

27. An apparatus for wireless communication, comprising:

means for receiving, at a decoder, a signal that comprises a plurality of error detection values and a plurality of information values;

means for decoding, using a polar code, one or more information values of the plurality of information values received in the signal;

means for determining one or more coefficients associated with an expected error detection value as part of an error check for the one or more information values, wherein each coefficient of the one or more coefficients is associated with an information value of the one or more information values;

means for determining a first error detection value based at least in part on the one or more coefficients associated with the one or more information values, wherein the first error detection value comprises the expected error detection value;

means for decoding, using the polar code, a second error detection value of the plurality of error detection values received in the signal, the second error detection value associated with the error check for the one or more information values received in the signal;

means for determining that the second error detection value received in the signal and associated with the error check for the one or more information values is different than the first error detection value; and means for terminating a decoding of remaining portions of the signal at the decoder that uses the polar code based at least in part on the first error detection value and the second error detection value.

28. A non-transitory computer-readable medium storing code for wireless communication, the code comprising instructions executable by a processor to:

receive, at a decoder, a signal that comprises a plurality of error detection values and a plurality of information values;

decode, using a polar code, one or more information values of the plurality of information values received in the signal;

determine one or more coefficients associated with an expected error detection value as part of an error check for the one or more information values, wherein each coefficient of the one or more coefficients is associated with an information value of the one or more information values;

determine a first error detection value based at least in part on the one or more coefficients associated with the one or more information values, wherein the first error detection value comprises the expected error detection value;
decode, using the polar code, a second error detection value of the plurality of error detection values received in the signal, the second error detection value associated with the error check for the one or more information values received in the signal;
determine that the second error detection value received in the signal and associated with the error check for the one or more information values is different than the first error detection value; and
terminate a decoding of remaining portions of the signal at the decoder that uses the polar code based at least in part on the first error detection value and the second error detection value.

* * * * *